US012399593B2

(12) United States Patent
Seo et al.

(10) Patent No.: US 12,399,593 B2
(45) Date of Patent: Aug. 26, 2025

(54) DISPLAY DEVICE

(71) Applicant: Samsung Display Co., Ltd., Yongin-si (KR)

(72) Inventors: Jina Seo, Seoul (KR); Su Jeong Kim, Seoul (KR); Suk Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 917 days.

(21) Appl. No.: 17/483,701

(22) Filed: Sep. 23, 2021

(65) Prior Publication Data

US 2022/0181406 A1 Jun. 9, 2022

(30) Foreign Application Priority Data

Dec. 4, 2020 (KR) ........................ 10-2020-0168320

(51) Int. Cl.
| | | |
|---|---|---|
| H01L 27/32 | (2006.01) | |
| G06F 3/044 | (2006.01) | |
| H10K 50/844 | (2023.01) | |
| H10K 50/86 | (2023.01) | |
| H10K 59/122 | (2023.01) | |
| H10K 59/38 | (2023.01) | |
| H10K 59/40 | (2023.01) | |
| H10K 59/65 | (2023.01) | |
| H10K 59/88 | (2023.01) | |
| G06V 40/13 | (2022.01) | |

(Continued)

(52) U.S. Cl.
CPC ......... *G06F 3/0443* (2019.05); *H10K 50/844* (2023.02); *H10K 50/865* (2023.02); *H10K 59/122* (2023.02); *H10K 59/38* (2023.02); *H10K 59/40* (2023.02); *H10K 59/65* (2023.02); *H10K 59/88* (2023.02); *G06F 3/0446* (2019.05); *G06V 40/1318* (2022.01); *H10K 59/131* (2023.02); *H10K 59/873* (2023.02); *H10K 59/8792* (2023.02)

(58) Field of Classification Search
None
See application file for complete search history.

(56) References Cited

U.S. PATENT DOCUMENTS

| 8,125,141 B2 | 2/2012 | Park et al. |
|---|---|---|
| 9,871,080 B2 | 1/2018 | Kim et al. |

(Continued)

FOREIGN PATENT DOCUMENTS

| CN | 111599846 A | 8/2020 |
|---|---|---|
| KR | 10-2011-0011421 A | 2/2011 |

(Continued)

*Primary Examiner* — William C Trapanese
(74) *Attorney, Agent, or Firm* — Womble Bond Dickinson (US) LLP

(57) ABSTRACT

A display device includes: a base substrate including a plurality of pixel areas and a plurality of sensing areas between the plurality of pixel areas; a pixel layer including a plurality of light emitting elements disposed on the plurality of pixel areas of the base substrate and a plurality of sensors disposed on the plurality of sensing areas of the base substrate, the plurality of sensors being adjacent to first light emitting elements among the light emitting elements; an input sensing layer including a conductive layer; and a color layer disposed between the pixel layer and the conductive layer.

29 Claims, 14 Drawing Sheets

(51) Int. Cl.
   *H10K 59/131*      (2023.01)
   *H10K 59/80*       (2023.01)

(56) References Cited

U.S. PATENT DOCUMENTS

| | | | |
|---|---|---|---|
| 10,388,702 | B2 | 8/2019 | Kim et al. |
| 10,476,038 | B2 | 11/2019 | Park et al. |
| 10,510,814 | B2 | 12/2019 | Sun et al. |
| 10,896,939 | B2 | 1/2021 | Jeon et al. |
| 11,450,714 | B2 | 9/2022 | Joo et al. |
| 11,721,122 | B2 | 8/2023 | Xu et al. |
| 2019/0129539 | A1* | 5/2019 | Kim .................... G06F 3/0412 |
| 2021/0096678 | A1* | 4/2021 | Kubota ................ G06F 3/0446 |
| 2022/0067340 | A1* | 3/2022 | Han .................... G06V 40/1365 |

FOREIGN PATENT DOCUMENTS

| | | |
|---|---|---|
| KR | 10-2016-0077415 A | 7/2016 |
| KR | 10-2016-0128514 | 11/2016 |
| KR | 10-2018-0047559 | 5/2018 |
| KR | 10-2019-0033118 A | 3/2019 |
| KR | 10-2019-0096472 | 8/2019 |
| KR | 10-2020-0075950 A | 6/2020 |
| WO | 2018/113207 | 6/2018 |

\* cited by examiner

DISPLAY DEVICE

CROSS-REFERENCE TO RELATED APPLICATION

This application claims priority from and the benefit of Korean Patent Application No. 10-2020-0168320, filed on Dec. 4, 2020, which is hereby incorporated by reference for all purposes as if fully set forth herein.

BACKGROUND

Field

Embodiments of the invention relate generally to a display device and more particularly, to a display device having an optical sensor.

Discussion of the Background

Display devices have been developed to provide a variety of functions to communicate organically with users. The functions of the display devices may include, e.g., displaying images to provide information to a user and sensing a user input. In recent years, the display devices have been developed to provide a function for sensing biometric information of the user by biometric information recognition methods.

The biometric information recognition methods may include, e.g., a capacitance method that senses a variation in capacitance between electrodes, an optical method that senses an incident light using an optical sensor, an ultrasonic method that senses a vibration using a piezoelectric material, or the like.

The above information disclosed in this Background section is only for understanding of the background of the inventive concepts, and, therefore, it may contain information that does not constitute prior art.

SUMMARY

Applicant discovered that when an optical sensor is embedded in display devices, the performance and the reliability of the optical sensor are degraded due to the reflection of light on conductive layers in the display devices.

Display devices constructed according to the principles of the invention are capable of improving the recognition performance and the sensing reliability of the optical sensor used for recognition of biometric information by providing a color layer (e.g., a light blocking layer or a light absorbing layer) for preventing and minimizing the reflection of light on the conductive layers.

According to the above, in a structure where the optical sensor used to recognize biometric information of a user are built in a display panel of the display devices, the light reflected by the conductive layer in the display panel is prevented from being incident to the sensors. Thus, the recognition performance and the sensing reliability of the optical sensor with respect to the biometric information are improved.

Additional features of the inventive concepts will be set forth in the description which follows, and in part will be apparent from the description, or may be learned by practice of the inventive concepts.

According to an aspect of the invention, a display device includes: a base substrate including a plurality of pixel areas and a plurality of sensing areas between the plurality of pixel areas; a pixel layer including a plurality of light emitting elements disposed on the plurality of pixel areas of the base substrate and a plurality of sensors disposed on the plurality of sensing areas of the base substrate, the plurality of sensors being adjacent to first light emitting elements among the light emitting elements; an input sensing layer including a conductive layer; and a color layer disposed between the pixel layer and the conductive layer.

The display device may further include a color filter layer including a plurality of color filters disposed to respectively overlap the light emitting elements, wherein the color layer includes a dummy color filter disposed to overlap the sensors and disposed between the plurality of pixel areas and the plurality of sensing areas.

The first light emitting elements may be configured to emit a first light having a first wavelength band, and the light emitting elements further include: second light emitting elements configured to emit a second light having a second wavelength band different from the first wavelength band; and third light emitting elements configured to emit a third light having a third wavelength band different from the first wavelength band and the second wavelength band.

The color filter layer may include: a first color filter having a first color and disposed to overlap the first light emitting elements; a second color filter having a second color different from the first color and disposed to overlap the second light emitting elements; and a third color filter having a third color different from the first color and the second color and disposed to overlap the third light emitting elements.

The dummy color filter may have the first color.

The color layer may have the second color and may include a same material as the second color filter.

The display device may further include a thin film encapsulation layer disposed between the pixel layer and the color layer.

The color layer may be disposed directly on the thin film encapsulation layer.

The display device may further include a light blocking layer disposed on the input sensing layer.

The color filter layer may be disposed directly on the input sensing layer.

The color filter layer may include: a first color filter having a first color and disposed to correspond to the first light emitting elements; a second color filter having a second color different from the first color and disposed to correspond to the second light emitting elements; and a third color filter having a third color different from the first color and the second color and disposed to correspond to the third light emitting elements.

The dummy color filter may have the first color.

The color filter layer may further include a light blocking layer having the second color and including a same material as the second color filter.

The color layer may be a light absorbing layer, and the color layer may have a width greater than a width of the conductive layer.

According to another aspect of the invention, a display device includes: a base substrate including a plurality of pixel areas and a plurality of sensing areas between the plurality of pixel areas; a pixel layer including a plurality of light emitting elements disposed on the plurality of pixel areas of the base substrate and a plurality of sensors disposed on the plurality of sensing areas of the base substrate, the plurality of sensors being adjacent to first light emitting elements among the light emitting elements; a first color filter layer disposed on the pixel layer; an input sensing layer disposed on the first color filter layer; and a second color filter layer disposed on the input sensing layer.

The first light emitting elements may be configured to emit a first light having a first wavelength band, and the first color filter layer may include a first color filter having a first color.

The first wavelength band may be a green wavelength band, and the first color may be a blue color.

The light emitting elements may further include: second light emitting elements configured to emit a second light having a second wavelength band different from the first wavelength band; and third light emitting elements configured to emit a third light having a third wavelength band different from the first wavelength band and the second wavelength band.

The second color filter layer may include: a second color filter having a second color different from the first color and disposed to overlap the first light emitting elements; and a third color filter having a third color different from the first color and the second color and disposed to correspond to the third light emitting elements.

The second color filter layer may further include a second dummy color filter having the second color and disposed to overlap the sensors.

The first color filter may be disposed to overlap the second light emitting elements.

The input sensing layer may include a conductive layer, and the first color filter layer may further include a first dummy color filter having the first color and disposed to overlap the conductive layer.

The first dummy color filter may have a width greater than a width of the conductive layer.

The conductive layer may include: a first conductive layer; and a second conductive layer disposed on the first conductive layer.

The input sensing layer may further include an insulating layer, the first conductive layer may be disposed on the first dummy color filter and covered by the insulating layer, and the second conductive layer may be disposed on the insulating layer.

The display device may further include a thin film encapsulation layer disposed between the pixel layer and the first color filter layer.

The display device may further include a light blocking layer disposed on the input sensing layer.

The pixel layer may further include a pixel definition layer including a first opening and a second opening, and wherein: the light emitting elements may be disposed in the first opening overlapping the plurality of pixel areas; and the sensors may be disposed in the second opening overlapping the plurality of sensing areas.

The pixel definition layer may include a black material.

Each of the sensors may include a photodiode.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
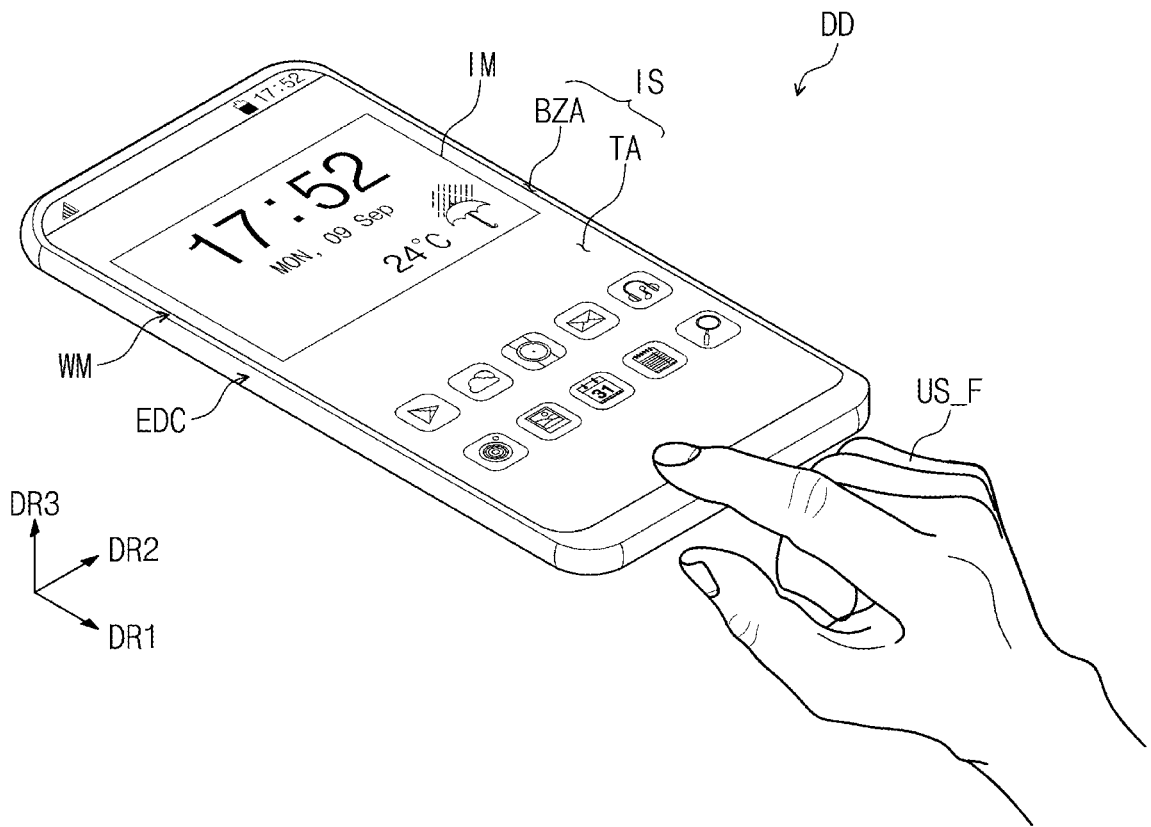
FIG. 1 is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the embodiments will be explained in detail with reference to the accompanying drawings.

FIG. 1 is a perspective view illustrating a display device DD according to an embodiment.

Referring to FIG. 1, the display device DD has a rectangular shape with long sides in a first direction DR1 and short sides in a second direction DR2 intersecting the first direction DR1. However, embodiments are not limited thereto, and the display device DD may have a variety of shapes, such as a circular shape, a polygonal shape, or the like.

The display device DD may be activated in response to electrical signals. The display device DD may be applied to various electronic devices. For example, the display device DD may be applied to electronic devices, such as a smart watch, a tablet computer, a notebook computer, a computer, a smart television, or the like.

Hereinafter, a direction substantially perpendicular to a plane defined by the first direction DR1 and the second direction DR2 is referred to as a third direction DR3. In the following descriptions, the expression "when viewed in a plane" or "on a plane" means a state of being viewed in the third direction DR3.

An upper surface of the display device DD may be defined as a display surface IS and may be a plane defined by the first direction DR1 and the second direction DR2. Images IM generated by the display device DD may be provided to a user through the display surface IS.

The display surface IS of the display device DD may be divided into a transmission area TA and a bezel area BZA. The images IM may be displayed through the transmission area TA. The user may view the images IM through the transmission area TA. In an embodiment, the transmission area TA may have a quadrangular shape with rounded vertices. However, this is merely one example, and the transmission area TA may have a variety of shapes and should not be particularly limited.

The bezel area BZA may be defined adjacent to the transmission area TA. The bezel area BZA may have a predetermined color. The bezel area BZA may surround the transmission area TA. Accordingly, the shape of the transmission area TA may be defined by the bezel area BZA, however, this is merely one example. For example, the bezel area BZA may be disposed adjacent to only one side of the transmission area TA or may be omitted. The display device DD according to the embodiment may be implemented in various embodiments, and it should not be particularly limited.

The display device DD may sense an external input applied thereto from the outside. The external input may include a variety of external inputs provided from the outside. For example, the external input may include an external input (e.g., a hovering input) in proximity to or approaching close to the display device DD at a predetermined distance as well as a touch input by a user's body, e.g., a hand of a user US_F. In addition, the external input may include various forms, such as force, pressure, temperature, or light.

Figure 2:
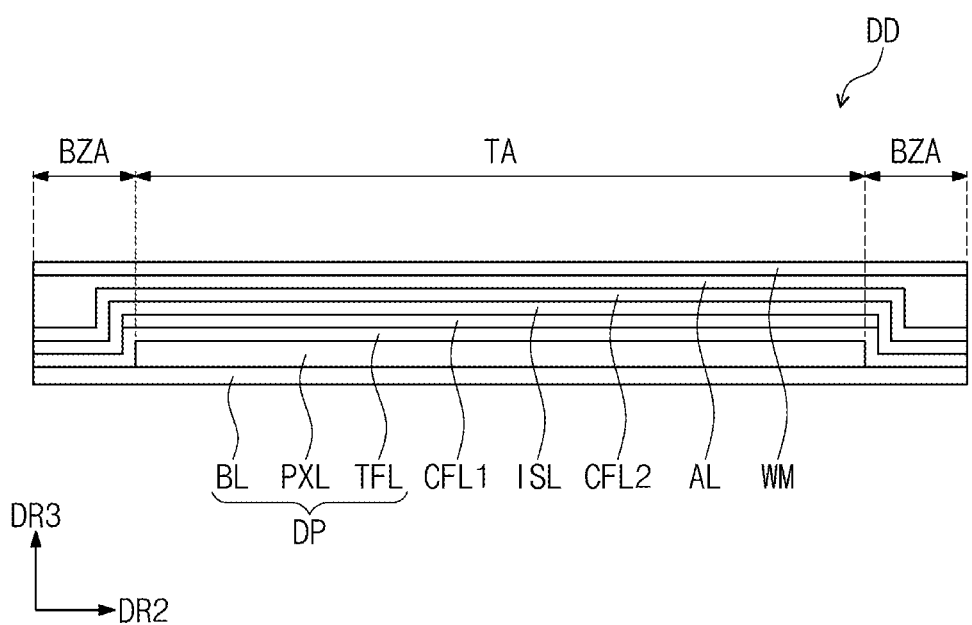
FIG. 2 is a cross-sectional view of the display device of FIG. 1.
Figure 3:
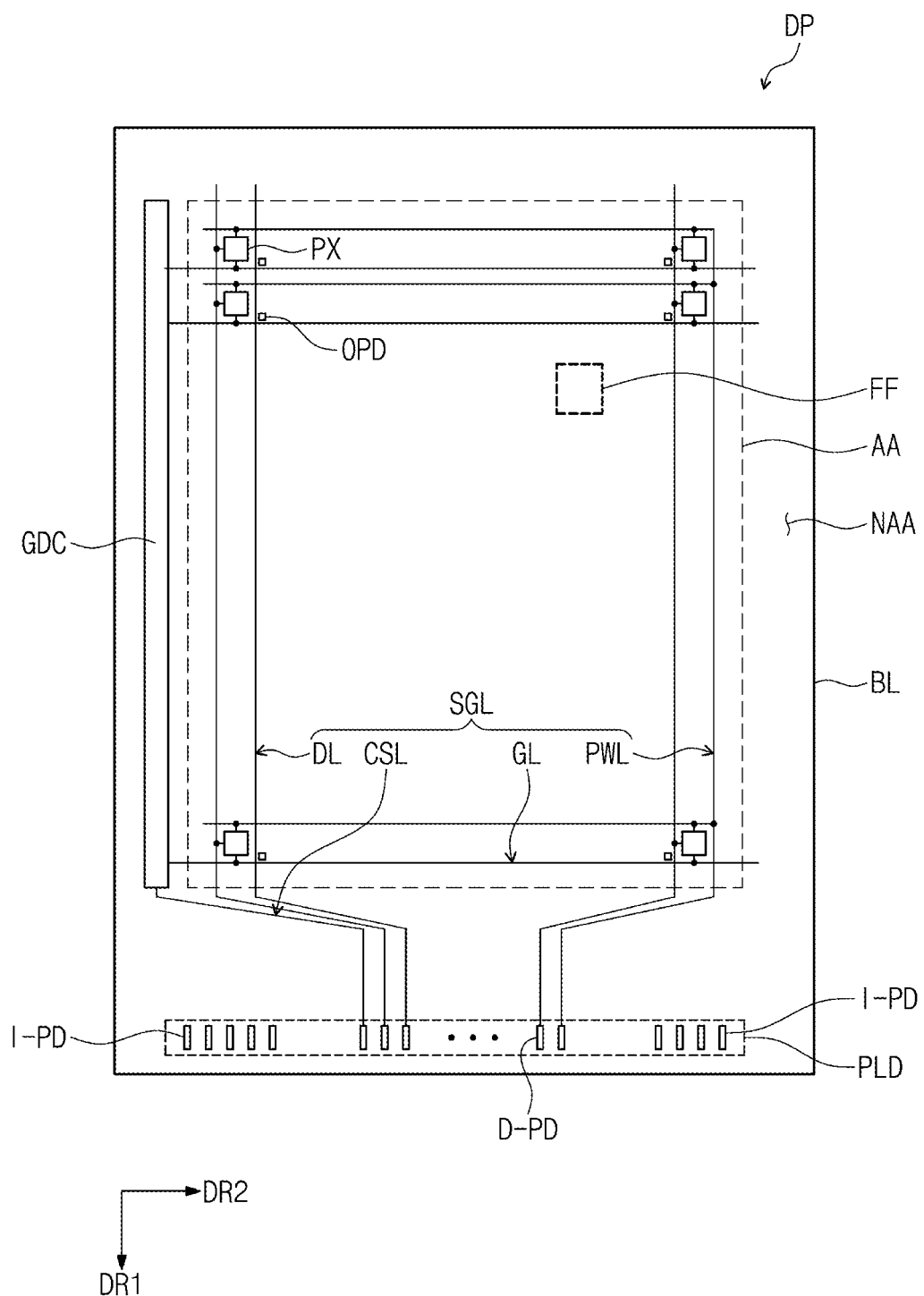
FIG. 3 is a plan view of a display panel of the display device of FIG. 1.
Figure 4:
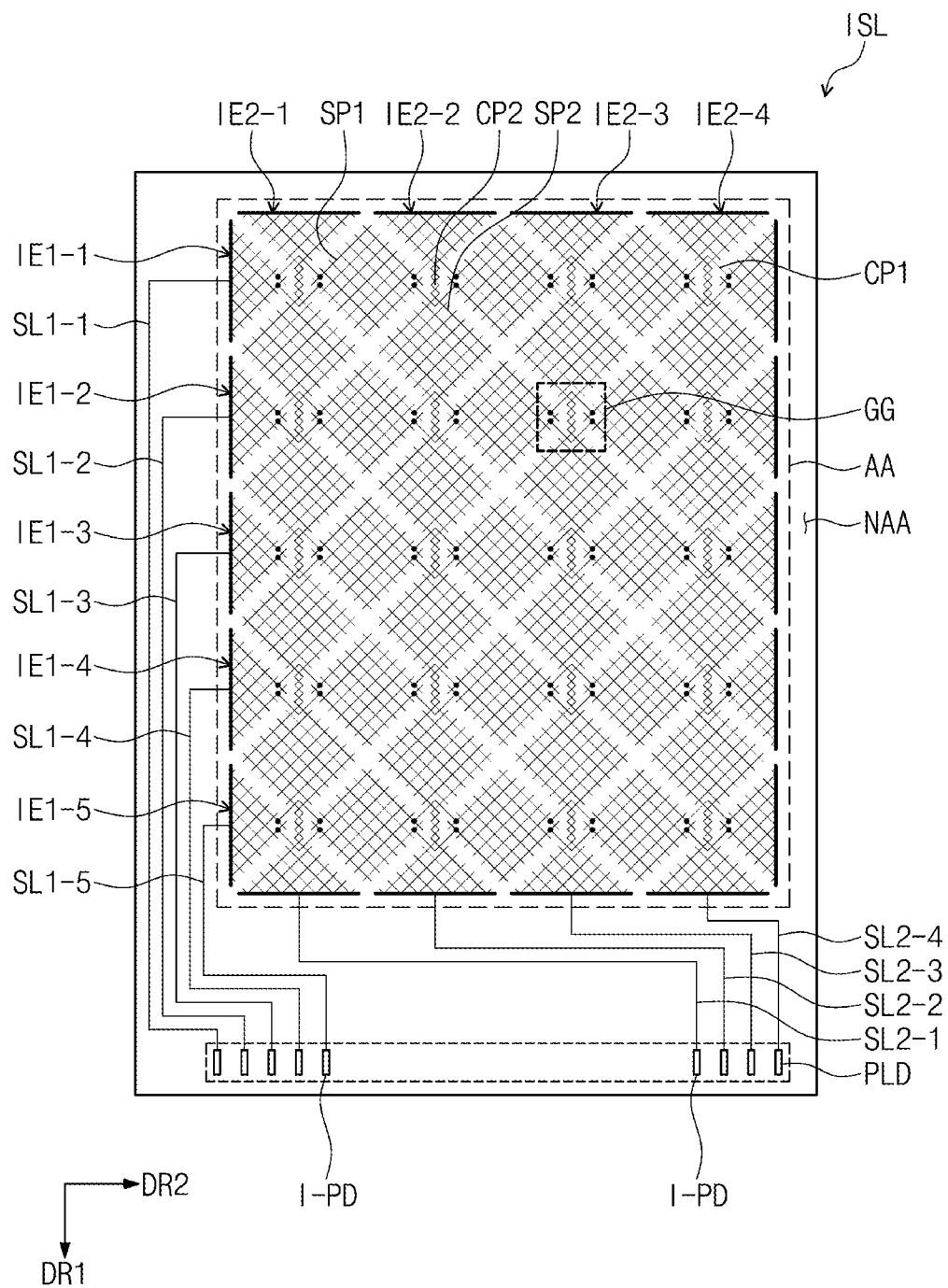
FIG. 4 is a plan view of an input sensing layer of the display device of FIG. 1.

FIG. 2 is a cross-sectional view illustrating the display device DD according to an embodiment. FIG. 3 is a plan view illustrating a display panel DP according to an embodiment, and FIG. 4 is a plan view illustrating an input sensing layer ISL according to an embodiment.

Referring to FIG. 2, the display device DD may include the display panel DP, a first color filter layer CFL1 disposed on the display panel DP, the input sensing layer ISL disposed on the first color filter layer CFL1, and a second color filter layer CFL2 disposed on the input sensing layer ISL.

The display panel DP according to an embodiment may be a light-emitting type display panel, however, embodiments are not be limited. For instance, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot and a quantum rod. Hereinafter, the organic light emitting display panel will be described as a representative example of the display panel DP.

The display panel DP may include a base substrate in the form of a base layer BL, a pixel layer PXL disposed on the base layer BL, and a thin film encapsulation layer TFL disposed on the pixel layer PXL.

Referring to FIGS. 2 and 3, the base layer BL may include a display area AA corresponding to the transmission area TA and a non-display area NAA corresponding to the bezel area BZA. The pixel layer PXL may be disposed on the base layer BL to correspond to the display area AA. The base layer BL may have a multi-layer structure.

The pixel layer PXL may include a plurality of pixels to display an image, and each of the pixels may include a light emitting element. The pixel layer PXL may include a sensor for sensing external information. The external information may be biometric information. As an example, the sensor may be an optical sensor in the form of an optical fingerprint sensor. For example, the optical fingerprint sensor may include a photodiode. The optical fingerprint sensor may sense a light reflected by a fingerprint of the user. A reflective path of the light will be described in detail later.

The thin film encapsulation layer TFL may be provided to cover the pixel layer PXL. The thin film encapsulation layer TFL may encapsulate the pixel layer PXL. The thin film encapsulation layer TFL may include at least two inorganic layers and one organic layer disposed between the inorganic layers. The inorganic layers may include an inorganic material and may protect the pixel layer PXL from moisture and oxygen, and the organic layer may include an organic material and may protect the pixel layer PXL from foreign substances such as dust particles.

The first color filter layer CFL1 may be disposed on the thin film encapsulation layer TFL. The first color filter layer CFL1 may include at least one color filter. As an example, the at least one color filter may have a first specific color. Accordingly, the at least one color filter of the first color filter layer CFL1 may absorb other color lights except the light having the first specific color.

The input sensing layer ISL may sense the external input, e.g., a user's touch, may convert the sensed external input to a predetermined input signal, and may apply the input signal to the display panel DP. The input sensing layer ISL may include a plurality of sensing electrodes to sense the external input. The sensing electrodes may sense the external input by a capacitance method. The display panel DP may receive the input signal from the input sensing layer ISL and may generate an image corresponding to the input signal.

The second color filter layer CFL2 may include a plurality of color filters. Each of the color filters may have a second specific color. The second specific color may be different from the first specific color. Accordingly, the color filters of the second color filter layer CFL2 may absorb other color lights except the light having the second specific color.

The first color filter layer CFL1, the input sensing layer ISL, and the second color filter layer CFL2 will be described in detail later.

The display device DD may further include a window WM and an adhesive layer AL. The window WM may protect the display panel DP and the input sensing layer ISL from external scratches and impacts. The window WM may be attached to the input sensing layer ISL by the adhesive layer AL. The adhesive layer AL may include an optically clear adhesive (OCA), an optically clear adhesive rein, a pressure sensitive adhesive (PSA), or the like.

The window WM may include a transparent material through which the image transmits. For example, the window WM may include glass, sapphire, or plastic. The window WM is shown in a single layer, however, embodiments are not be limited thereto or thereby. The window WM may include plural layers. For example, the bezel area BZA of the display device DD may be obtained by printing a material having the predetermined color on an area of the window WM. The image generated by the display panel DP may be provided to the user through the window WM.

The display device DD may further include an external case EDC (refer to FIG. 1) coupled to the window WM to define an exterior of the display device DD. The external case EDC may absorb impacts applied thereto from the outside and may prevent foreign substance and moisture from entering the display device DD, thereby protecting components accommodated in the external case EDC. As an example, the external case EDC may be provided in a form in which a plurality of accommodation members is combined.

Referring to FIG. 3, the display panel DP may include a driving circuit GDC, a plurality of signal lines SGL, and a plurality of pixels PX. The display panel DP may further include a pad part PLD disposed in the non-display area NAA. The pad part PLD may include pixel pads D-PD each being connected to a corresponding signal line among the signal lines SGL.

The pixels PX may be arranged in the display area AA of the base layer BL. Each of the pixels PX may include a light emitting element and a pixel driving circuit connected to the light emitting element. The driving circuit GDC, the signal lines SGL, the pad part PLD, and the pixel driving circuit may be included in a circuit layer DP_CL shown in FIG. 6A.

The driving circuit GDC may include a gate driving circuit. The gate driving circuit may generate a plurality of gate signals and may sequentially output the gate signals to a plurality of gate lines GL described later. The gate driving circuit may further output another control signal to the pixel driving circuit.

The signal lines SGL may include the gate lines GL, data lines DL, a power line PWL, and a control signal line CSL. Each of the gate lines GL may be connected to corresponding pixels among the pixels PX, and each of the data lines DL may be connected to corresponding pixels among the pixels PX. The power line PWL may be connected to the pixels PX. The control signal line CSL may provide control signals to the driving circuit GDC. The signal lines SGL may overlap the display area AA and the non-display area NAA.

The display panel DP may further include sensors OPD disposed adjacent to certain pixels among the pixels PX. The sensors OPD may be disposed in the display area AA of the base layer BL. Each of the sensors OPD may have a size smaller than a size of each of the pixels. The signal lines SGL may further include sensing lines connected to the sensors OPD.

The pad part PLD may be connected to a flexible circuit film and may include the pixel pads D-PD connecting the flexible circuit film to the display panel DP and input pads I-PD connecting the flexible circuit film to the input sensing layer ISL. The pixel pads D-PD and the input pads I-PD may be provided by exposing some of lines that are arranged on the circuit layer DP_CL without being covered by an insulating layer included in the circuit layer DP_CL.

The pixel pads D-PD may be connected to corresponding pixels PX via the signal lines SGL. In addition, any one of the pixel pads D-PD may be connected to the driving circuit GDC. The pixel pads D-PD may further include sensor pads connected to corresponding sensors OPD via sensing lines. In this case, a sensor driving circuit may be provided to the flexible circuit film to drive the sensors OPD, and the sensor driving circuit may be electrically connected to the sensors OPD via the sensor pads and the sensing lines.

Referring to FIG. 4, the input sensing layer ISL according to an embodiment may include first sensing electrodes IE1-1 to IE1-5, first signal lines SL1-1 to SL1-5 connected to the first sensing electrodes IE1-1 to IE1-5, second sensing electrodes IE2-1 to IE2-4, and second signal lines SL2-1 to SL2-4 connected to the second sensing electrodes IE2-1 to IE2-4. As an example, the input sensing layer ISL may further include third signal lines connected to the second sensing electrodes IE2-1 to IE2-4. In this case, the second signal lines SL2-1 to SL2-4 may be connected to one ends of the second sensing electrodes IE2-1 to IE2-4, and the third signal lines may be connected to the other ends of the second sensing electrodes IE2-1 to IE2-4.

The first sensing electrodes IE1-1 to IE1-5 may cross the second sensing electrodes IE2-1 to IE2-4. The first sensing electrodes IE1-1 to IE1-5 may be arranged in the first direction DR1 and may extend in the second direction DR2.

Each of the first sensing electrodes IE1-1 to IE1-5 may include first sensing portions SP1 and first connection portions CP1, which are disposed in the display area AA. Each of the second sensing electrodes IE2-1 to IE2-4 may include second sensing portions SP2 and second connection portions CP2, which are disposed in the display area AA. Among the first sensing portions SP1, two first sensing portions disposed at opposite ends of a first electrode may have a smaller size (e.g., about ½ size) than a size of the first sensing portion disposed at a center portion. Among the second sensing portions SP2, two second sensing portions disposed at opposite ends of a second electrode may have a smaller size (e.g., about ½ size) than a size of the second sensing portion disposed at a center portion.

FIG. 4 shows the first sensing electrodes IE1-1 to IE1-5 and the second sensing electrodes IE2-1 to IE2-4 according to an embodiment, however, shapes of the electrodes should not be limited thereto or thereby. According to an embodiment, the first sensing electrodes IE1-1 to IE1-5 and the second sensing electrodes IE2-1 to IE2-4 may have a shape in which the sensing portion and the connection portion are not distinguished from each other, such as a bar shape. The first sensing portions SP1 and the second sensing portions SP2 may have a lozenge shape, however, embodiments are not be limited thereto or thereby. The first sensing portions SP1 and the second sensing portions SP2 may have other polygonal shapes.

In one first sensing electrode, the first sensing portions SP1 may be arranged in the second direction DR2, and in one second sensing electrode, the second sensing portions SP2 may be arranged in the first direction DR1. Each of the first connection portions CP1 may connect first sensing portions SP1 adjacent to each other (e.g., in the second direction DR2), and each of the second connection portions CP2 may connect second sensing portions SP2 adjacent to each other (e.g., in the first direction DR1).

The first sensing electrodes IE1-1 to IE1-5 and the second sensing electrodes IE2-1 to IE2-4 may have a mesh shape. As the first sensing electrodes IE1-1 to IE1-5 and the second sensing electrodes IE2-1 to IE2-4 have the mesh shape, a parasitic capacitance between with the electrodes of the display panel DP (refer to FIG. 3) and the first sensing electrodes IE1-1 to IE1-5 and the second sensing electrodes IE2-1 to IE2-4 may be reduced. In addition, as described later, the first sensing electrodes IE1-1 to IE1-5 and the second sensing electrodes IE2-1 to IE2-4 do not overlap light emitting elements ED1, ED2, and ED3 (refer to FIG. 5A), and thus, the first sensing electrodes IE1-1 to IE1-5 and the second sensing electrodes IE2-1 to IE2-4 may not be viewed to the user who uses the display device DD.

The first sensing electrodes IE1-1 to IE1-5 and the second sensing electrodes IE2-1 to IE2-4 having the mesh shape may include silver, aluminum, copper, chromium, nickel, titanium, or the like, which may be processed at a low temperature, however, embodiments are not be limited thereto or thereby. Accordingly, although the input sensing layer ISL is formed through successive processes, damages on the light emitting elements ED1 to ED3 may be prevented.

The first signal lines SL1-1 to SL1-5 may be respectively connected to one ends of the first sensing electrodes IE1-1 to IE1-5. According to an embodiment, the input sensing layer ISL may further include signal lines connected to the other ends of the first sensing electrodes IE1-1 to IE1-5.

The first signal lines SL1-1 to SL1-5 and the second signal lines SL2-1 to SL2-4 may be disposed in the non-display area NAA. The input sensing layer ISL may include the input pads I-PD that extend from one ends of the first signal lines SL1-1 to SL1-5 and one ends of the second signal lines SL2-1 to SL2-4 and disposed in the non-display area NAA.

Figure 5A:
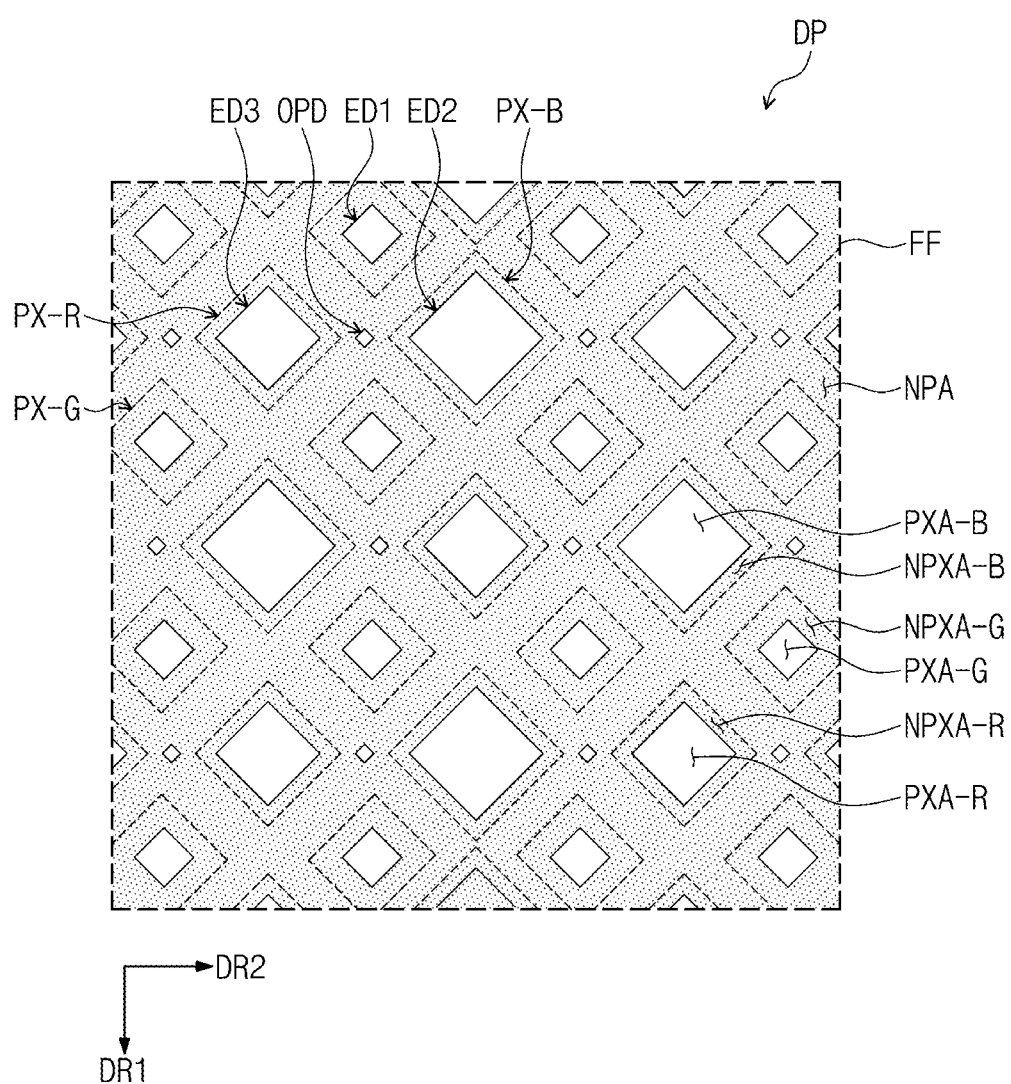
FIG. 5A is an enlarged plan view of an area FF of the display panel of FIG. 3.
Figure 5B:
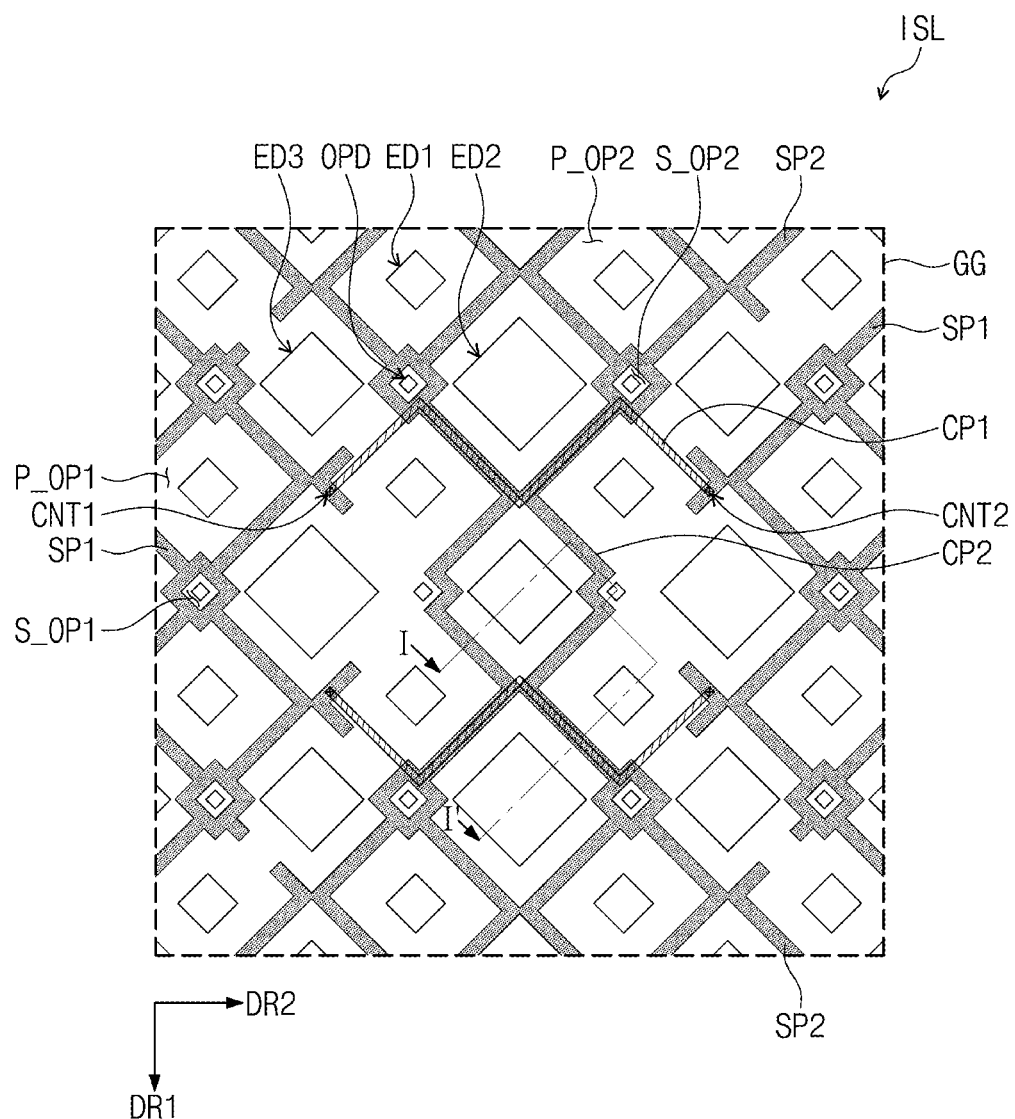
FIG. 5B is an enlarged plan view of an area GG of the input sensing layer of FIG. 4.

FIG. 5A is an enlarged plan view illustrating an area FF of the display panel DP shown in FIG. 3, and FIG. 5B is an enlarged plan view illustrating an area GG of the input sensing layer ISL shown in FIG. 4.

Referring to FIGS. 3 and 5A, the display panel DP may include a plurality of pixels PX. As an example, each of the pixels PX may be one of a plurality of first pixels PX-G, a plurality of second pixels PX-B, and a plurality of third pixels PX-R. As an example, the first pixels PX-G, the second pixels PX-B, and the third pixels PX-R may have different sizes from each other. For example, the first pixels PX-G may have a size (e.g. an area) smaller than that of the third pixels PX-R, and the second pixels PX-B may have a size (e.g., an area) greater than that of the third pixels PX-R. As an example, the first pixels PX-G may be green pixels, the second pixels PX-B may be blue pixels, and the third pixels PX-R may be red pixels.

The first pixels PX-G may be arranged along the first and second directions DR1 and DR2. The second and third pixels PX-B and PX-R may be alternately arranged with each other and may be arranged along the first and second directions DR1 and DR2. A non-pixel area NPA may be defined between the first, second, and third pixels PX-G, PX-B, and PX-R.

The arrangement of the first, second, and third pixels PX-G, PX-B, and PX-R shown in FIG. 5A is merely one example, and embodiments are not be limited thereto or thereby. For instance, according to an embodiment, the first, second, and third pixels PX-G, PX-B, and PX-R may be arranged in an arrangement in which the first pixel PX-G, the second pixel PX-B, and the third pixel PX-R are alternately arranged in the second direction DR2. In addition, the first, second, and third pixels PX-G, PX-B, and PX-R each having a quadrangular shape are shown, however, embodiments are not be limited thereto or thereby. For example, the shape of each of the first, second, and third pixels PX-G, PX-B, and PX-R may be changed in various ways, e.g., a polygonal shape, a circular shape, an oval shape, or the like. As another example, the first, second, and third pixels PX-G, PX-B, and PX-R may have different shapes from each other. As an example, the first pixel PX-G may have a circular shape, and the second and third pixels PX-B and PX-R may have a quadrangular shape.

In addition, FIG. 5A shows the structure in which the size of the first pixels PX-G is smaller than the size of the second pixels PX-B and the size of the third pixels PX-R, however, embodiments are not be limited thereto or thereby. For instance, according to an embodiment, the first, second, and third pixels PX-G, PX-B, and PX-R may have substantially the same size as each other.

Each of the first pixels PX-G may include a first light emitting element ED1 for emitting a first light, each of the second pixels PX-B may include a second light emitting element ED2 for emitting a second light, and each of the third pixels PX-R may include a third light emitting element ED3 for emitting a third light. Accordingly, each of the first pixels PX-G may include a first light emitting area PXA-G from which the first light emits and a first non-light-emitting area NPXA-G defined around the first light emitting area PXA-G. Each of the second pixels PX-B may include a second light emitting area PXA-B from which the second light emits and a second non-light-emitting area NPXA-B defined around the second light emitting area PXA-B. Each of the third pixels PX-R may include a third light emitting area PXA-R from which the third light emits and a third non-light-emitting area NPXA-R defined around the third light emitting area PXA-R. In an embodiment, the first light may be a light in a green wavelength band, the second light may be in a light in a blue wavelength band, and the third light may be a light in a red wavelength band. The first, second, and third non-light-emitting areas NPXA-G, NPXA-B, and NPXA-R may be areas from which the light does not emit.

The display panel DP may further include the sensors OPD disposed not to overlap the first, second, third light emitting areas PXA-G, PXA-B, and PXA-R. The sensors OPD may be arranged along the first and second directions DR1 and DR2 in a matrix form. The sensors OPD may be disposed between two first pixels PX-G adjacent to each other in the first direction DR1. The sensors OPD may be disposed between the second and third pixels PX-B and PX-R adjacent to each other in the second direction DR2. Each of the sensors OPD may have a size (e.g., an area) smaller than the size (e.g., the area) of the first pixels PX-G. However, the size of each of the sensors OPD and the arrangement of the sensors OPD should not be limited thereto or thereby and may be changed in various ways.

Referring to FIGS. 5A and 5B, each of the first and second sensing portions SP1 and SP2 of the input sensing layer ISL may have a mesh shape. Each of the first sensing portions SP1 may include a plurality of first pixel openings P_OP1, in which the first, second, third pixels PX-G, PX-B, and PX-R are respectively disposed (e.g., in a plan view). Each of the second sensing portions SP2 may include a plurality of second pixel openings P_OP2, in which the first, second, and third pixels PX-G, PX-B, and PX-R are respectively disposed (e.g., in a plan view). For example, the first sensing portions SP1 and the second sensing portions SP2 may not overlap the first pixels PX-G, the second pixels PX-B, and the third pixels PX-R when viewed in a plane. As each of the first and second sensing portions SP1 and SP2 is disposed to correspond to the non-pixel area NPA, an aperture ratio of the first, second, and third pixels PX-G, PX-B, and PX-R may increase, and as a result, the parasitic capacitance may be reduced. Alternatively, each of the first and second sensing portions SP1 and SP2 may partially overlap the first, second, and third non-light-emitting areas NPXA-G, NPXA-B, and NPXA-R.

The first sensing portions SP1 spaced apart from each other in the second direction DR2 may be electrically connected to each other by the first connection portion CP1. The first connection portion CP1 may be disposed on a layer different from a layer on which the first sensing portions SP1 are disposed. A first contact portion CNT1 may be provided at a first end of the first connection portion CP1, and a second contact portion CNT2 may be provided at a second end of the first connection portion CP1. In the first and second contact portions CNT1 and CNT2, the first connection portion CP1 may be directly connected to corresponding two first sensing portions SP1.

The second sensing portions SP2 spaced apart from each other in the first direction DR1 may be electrically connected to each other by the second connection portion CP2. As an example, the second connection portion CP2 and the second sensing portions SP2 may be disposed on the same layer and may be integrally formed with each other.

As an example, each of the first sensing portions SP1 may include a plurality of first sensor openings S_OP1, in which the sensors OPD are respectively disposed (e.g., in a plan view). Each of the second sensing portions SP2 may include a plurality of second sensor openings S_OP2, in which the sensors OPD are respectively disposed (e.g., in a plan view). For example, the first sensing portions SP1 and the second sensing portions SP2 may not overlap the sensors OPD when viewed in a plane. As each of the first and second sensing portions SP1 and SP2 does not overlap the sensors OPD, an aperture ratio of the sensors OPD may be improved, and an amount of light incident into the sensors OPD may increase.

Figure 6A:
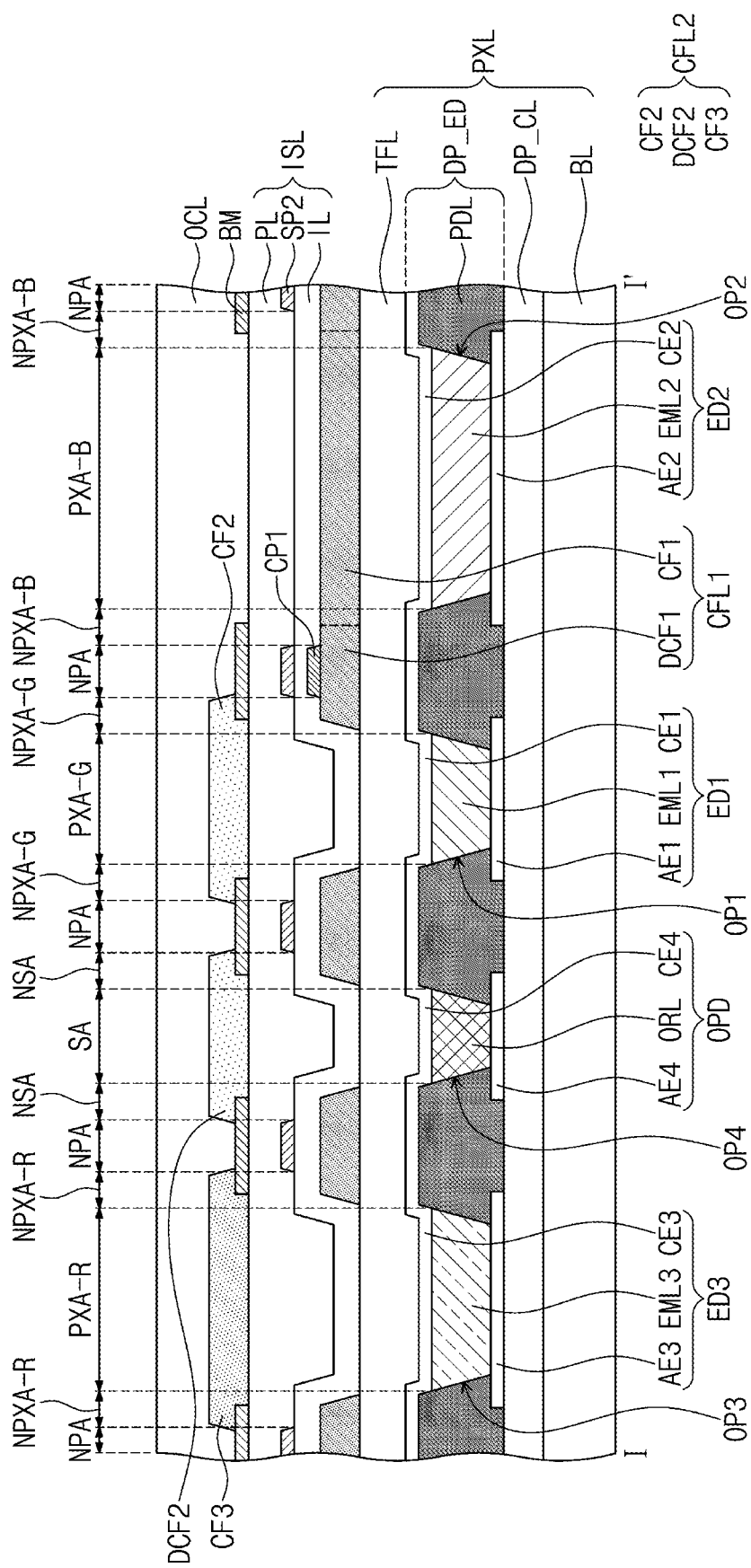
FIG. 6A is a cross-sectional view taken along a line I-I' of FIG. 5B illustrating an embodiment of the input sensing layer and the display panel of the display device of FIG. 1.
Figure 6B:
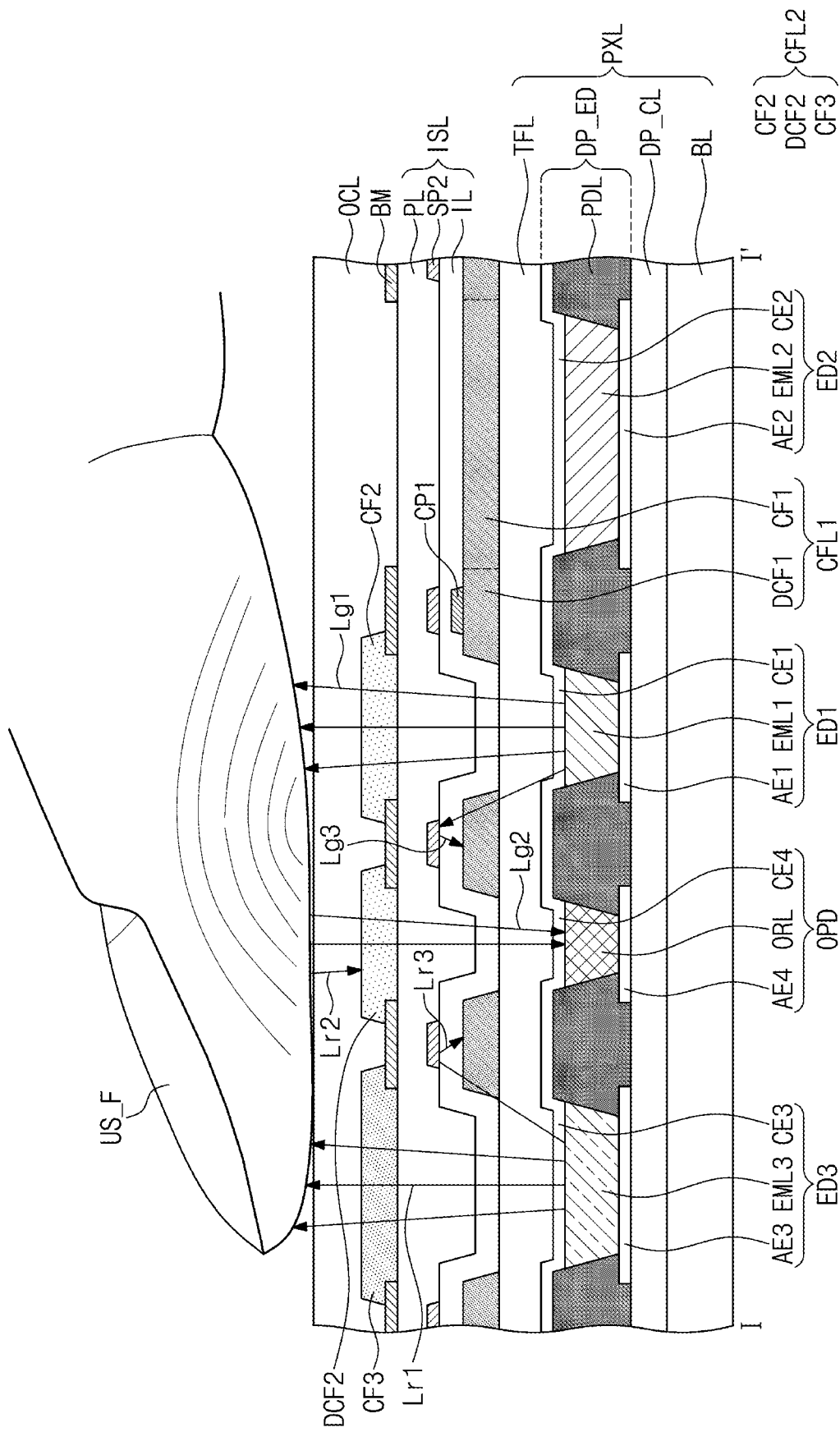
FIG. 6B is a cross-sectional view illustrating a fingerprint sensing process of the display device of FIG. 6A.
Figure 7:
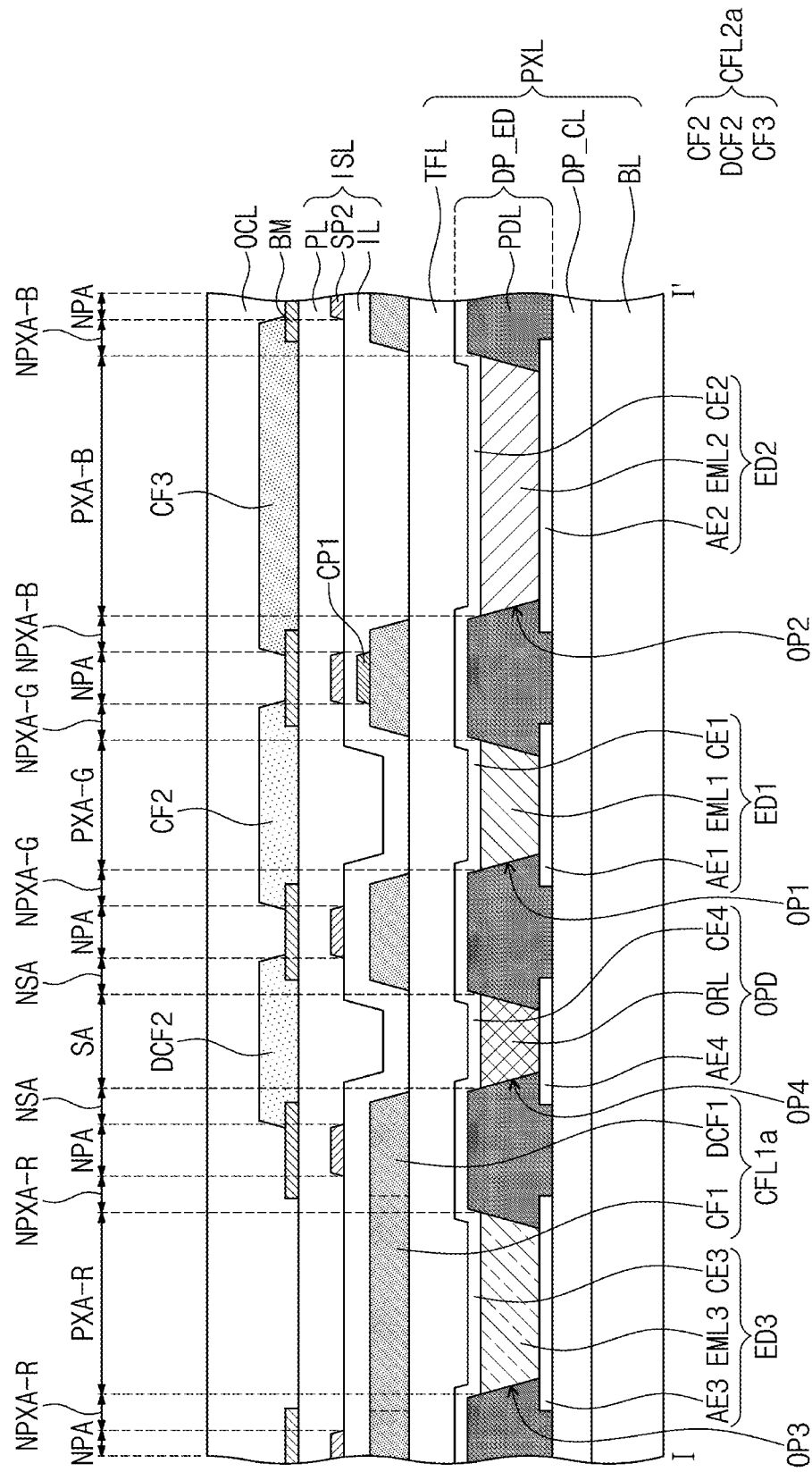
FIG. 7 is a cross-sectional view taken along a line I-I' of FIG. 5B illustrating another embodiment of the input sensing layer and the display panel of the display device of FIG. 1.

FIG. 6A is a cross-sectional view taken along a line I-I' shown in FIG. 5B according to an embodiment, and FIG. 6B is a cross-sectional view illustrating a fingerprint sensing process of a sensor shown in FIG. 6A. FIG. 7 is a cross-sectional view taken along a line I-I' shown in FIG. 5B according to an embodiment.

Referring to FIGS. 2, 3, 6A, and 6B, the display panel DP of the display device DD may include the base layer BL, the pixel layer PXL disposed on the base layer BL, and the thin film encapsulation layer TFL. The display panel DP may include the display area AA corresponding to the transmission area TA and the non-display area NAA corresponding to the bezel area BZA. The base layer BL of the display panel DP may include a plurality of pixel areas in the form of first, second, and third light emitting areas PXA-G, PXA-B, and PXA-R, a non-pixel area NPA, a plurality of sensing areas SA, a non-sensing area NSA, and first, second, and third non-light-emitting areas NPXA-G, NPXA-B, and NPXA-R.

The base layer BL may include a synthetic resin film. The synthetic resin film may be formed on a work substrate used to manufacture the display panel DP. Then, a conductive layer and an insulating layer may be formed on the synthetic resin film. When the work substrate is removed, the synthetic resin layer may correspond to the base layer BL. The synthetic resin film may be a polyimide-based resin layer, however, a material for the synthetic resin film should not be particularly limited. In addition, the base layer BL may include a glass substrate, a metal substrate, or an organic/inorganic composite substrate.

The pixel layer PXL may include the circuit layer DP_CL disposed on the base layer BL and a display element layer DP_ED disposed on the circuit layer DP_CL.

The circuit layer DP_CL may include at least one insulating layer and a circuit element. Hereinafter, the insulating layer included in the circuit layer DP_CL is referred to as an intermediate insulating layer. The intermediate insulating layer may include at least one intermediate inorganic layer and at least one intermediate organic layer. The circuit element may include a signal line and a pixel driving circuit. The circuit layer DP_CL may be formed through processes of coating and depositing an insulating layer, a semiconductor layer, and a conductive layer and processes of patterning the insulating layer, the semiconductor layer, and the conductive layer using a photolithography process.

The display element layer DP_ED may include a pixel definition layer PDL and the light emitting elements ED1, ED2, and ED3. The pixel definition layer PDL may include an organic material. As an example, the light emitting elements ED1, ED2, and ED3 may include the first light emitting elements ED1, the second light emitting elements ED2, and the third light emitting elements ED3. The pixel definition layer PDL may include first openings OP1, in which the first light emitting elements ED1 are disposed, second openings OP2, in which the second light emitting elements ED2 are disposed, and third openings OP3, in which the third light emitting elements ED3 are disposed. The first, second, and third openings OP1, OP2, and OP3 may have different sizes (e.g., areas) from each other.

A first electrode layer may be disposed on the circuit layer DP_CL. The pixel definition layer PDL may be formed on the first electrode layer. The first electrode layer may include first, second, and third anode electrodes AE1, AE2, and AE3. The first, second, and third openings OP1, OP2, and OP3 of the pixel definition layer PDL may respectively expose at least a portion of the first, second, and third anode electrodes AE1, AE2, and AE3. According to an embodiment, the pixel definition layer PDL may further include a black material. The pixel definition layer PDL may further include a black organic dye/pigment, such as a carbon black or an aniline black. The pixel definition layer PDL may be formed by mixing a blue organic material with a black organic material. The pixel definition layer PDL may further include a liquid-repellent organic material.

As shown in FIGS. 5A and 6A, the display panel DP may include first, second, and third light emitting areas PXA-G, PXA-B, and PXA-R and first, second, and third non-light-emitting areas NPXA-G, NPXA-B, and NPXA-R adjacent to the first, second, and third light emitting areas PXA-G, PXA-B, and PXA-R. Each of the non-light-emitting areas NPXA-G, NPXA-B, and NPXA-R may surround a corresponding light emitting area of the light emitting areas PXA-G, PXA-B, and PXA-R. According to an embodiment, the first light emitting area PXA-G may be defined to correspond to a portion of the first anode electrode AE1 exposed through the first opening OP1. The second light emitting area PXA-B may be defined to correspond to a portion of the second anode electrode AE2 exposed through the second opening OP2. The third light emitting area PXA-R may be defined to correspond to a portion of the third anode electrode AE3 exposed through the third opening OP3. The non-pixel area NPA may be defined between the first, second, and third non-light-emitting areas NPXA-G, NPXA-B, and NPXA-B.

The light emitting layer may be disposed on the first electrode layer. The light emitting layer may include first, second, and third light emitting layers EML1, EML2, and EML3. The first, second, and third light emitting layers EML1, EML2, and EML3 may be disposed in areas respectively corresponding to the first, second, and third openings OP1, OP2, and OP3. The first, second, and third light emitting layers EML1, EML2, and EML3 may be formed in the first, second, and third pixels PX-G, PX-B, and PX-R and may be separated from each other. Each of the first, second, and third light emitting layers EML1, EML2, and EML3 may include an organic material and/or an inorganic material. The first, second, and third light emitting layers EML1, EML2, and EML3 may generate a predetermined color light. For example, the first light emitting layer EML1 may generate a green light, the second light emitting layer EML2 may generate a blue light, and the third light emitting layer EML3 may generate a red light.

In an embodiment, the patterned first, second, and third light emitting layers EML1, EML2, and EML3 are shown as a representative example, however, one light emitting layer may be commonly disposed in the first, second, and third light emitting areas PXA-G, PXA-B, and PXA-R. In this case, the light emitting layer may generate a white light or a blue light. In addition, the light emitting layer may have a multi-layer structure that is called a tandem.

Each of the first, second, and third light emitting layers EML1, EML2, and EML3 may include a low molecular weight organic material or a high molecular weight organic material as the light emitting material. For example, each of the first, second, and third light emitting layers EML1, EML2, and EML3 may include a quantum dot as the light emitting material. A core of the quantum dot may be selected from a group II-VI compound, a group III-V compound, a group IV-VI compound, a group IV element, a group IV compound, and combinations thereof.

A second electrode layer may be disposed on the light emitting layer. The second electrode layer may include first, second, and third cathode electrodes CE1, CE2, and CE3. The first, second, and third cathode electrodes CE1, CE2, and CE3 may be electrically connected to each other. As an example, the first, second, and third cathode electrodes CE1, CE2, and CE3 may be provided integrally with each other. In this case, the first, second, and third cathode electrodes CE1, CE2, and CE3 may be commonly disposed in the first, second, and third light emitting areas PXA-G, PXA-B, and PXA-R, the first, second, and third non-light-emitting areas NPXA-G, NPXA-B, and NPXA-R, and the non-pixel area NPA.

The thin film encapsulation layer TFL may be disposed on the second electrode layer. The thin film encapsulation layer TFL may encapsulate the display element layer DP_ED. The thin film encapsulation layer TFL may include at least one insulating layer. According to an embodiment, the thin film encapsulation layer TFL may include at least one inorganic layer (hereinafter, referred to as an encapsulation inorganic layer). According to an embodiment, the thin film encapsulation layer TFL may include at least one organic layer (hereinafter, referred to as an encapsulation organic layer) and at least one encapsulation inorganic layer.

The encapsulation inorganic layer may protect the display element layer DP_ED from moisture and oxygen, and the encapsulation organic layer may protect the display element layer DP_ED from a foreign substance such as dust particles. The encapsulation inorganic layer may include a silicon nitride layer, silicon oxynitride layer, a silicon oxide layer, a titanium oxide layer, or an aluminum oxide layer, however, embodiments are not be limited thereto or thereby. The encapsulation organic layer may include an acrylic-based organic layer, however, embodiments are not be particularly limited.

The display element layer DP_ED may further include the sensors OPD. Each of the sensors OPD may include the photodiode. The pixel definition layer PDL may include a fourth opening OP4, in which the sensors OPD are disposed (e.g., in a plan view).

Each of the sensors OPD may include a first electrode AE4, a light sensing layer ORL, and a second electrode CE4. The first electrode AE4 and the first electrode layer (e.g., the first, second, and third anode electrodes AE1, AE2, and AE3) may be disposed on the same layer (e.g., the circuit layer DP_CL). For example, the first electrode AE4 may be disposed on the circuit layer DP_CL and may be substantially simultaneously formed with the first, second, and third anode electrodes AE1, AE2, and AE3 through the same process.

The fourth opening OP4 of the pixel definition layer PDL may expose at least a portion of the first electrode AE4. The light sensing layer ORL may be disposed on the first electrode AE4 exposed through the fourth opening OP4. The light sensing layer ORL may include an organic photo-sensing material. The second electrode CE4 may be disposed on the light sensing layer ORL. The second electrode CE4 may be substantially simultaneously formed with the first, second, and third cathode electrodes CE1, CE2, and CE3 through the same process. As an example, the second electrode CE4 may be integrally formed with the first, second, and third cathode electrodes CE1, CE2, and CE3.

Each of the first and second electrodes AE4 and CE4 may receive an electrical signal. The second electrode CE4 and the first electrode AE4 may receive different signals from each other. Accordingly, an electric field may be formed between the first and second electrodes AE4 and CE4. The light sensing layer ORL may generate an electric signal corresponding to a light incident to the sensor. The light sensing layer ORL may absorb an energy of the light incident thereto and may generate electric charges. For example, the light sensing layer ORL may include a photosensitive semiconductor material.

The electric charges generated by the light sensing layer ORL may cause a change of the electric field formed between the first electrode AE4 and the second electrode CE4. An amount of the electric charges generated by the light sensing layer ORL may be changed according to whether the light is incident into the sensors OPD and the amount and intensity of the light incident into the sensors OPD. Accordingly, the electric field formed between the first electrode AE4 and the second electrode CE4 may be changed. The sensors OPD according to an embodiment may obtain fingerprint information of the user based on a variation in electric field between the first electrode AE4 and the second electrode CE4.

However, this is merely one example, and each of the sensors OPD may include a photo-transistor including the light sensing layer ORL as its active layer. In this case, each of the sensors OPD may sense an amount of current flowing through the photo-transistor to obtain the fingerprint information. According to an embodiment, each of the sensors OPD may include various photoelectric conversion elements that generate electrical signals in response to the light amount variation, and the sensors OPD should not be particularly limited.

As an example, each of the sensors OPD may be disposed adjacent to the first light emitting elements ED1 among the first, second, and third light emitting elements ED1, ED2, and ED3. For example, each of the sensors OPD may receive a first reflected light Lg2, which is generated by the reflection of a first light Lg1 on the user's fingerprint after the first light Lg1 is emitted from the first light emitting elements ED1. The first light Lg1 and the first reflected light Lg2 may be lights having the green wavelength band.

The first color filter layer CFL1 may be disposed directly on the display panel DP. The first color filter layer CFL1 may be disposed directly on the thin film encapsulation layer TFL of the display panel DP. The first color filter layer CFL1 may include a first color filter CF1 having a first color. The first color filter CF1 may be disposed to overlap one light emitting element of the first, second, and third light emitting elements ED1, ED2, and ED3. As an example, the first color filter CF1 may have a blue color, and in this case, the first color filter CF1 may be disposed in the second light emitting area PXA-B to overlap the second light emitting element ED2, however, embodiments are not be limited thereto or thereby. As shown in FIG. 7, the first color filter CF1 may have a red color, and in this case, the first color filter CF1 may be disposed in the third light emitting area PXA-R to overlap the third light emitting element ED3.

The first color filter layer CFL1 may further include a color layer in the form of a first dummy color filter DCF1. The first dummy color filter DCF1 may be disposed to overlap the non-pixel area NPA. The first dummy color filter DCF1 may be disposed in the non-pixel area NPA to overlap first and second conductive layers included in the first and second sensing portions SP1 and SP2. The first dummy color filter DCF1 may have a width greater than a width of each of the first and second conductive layers. As an example, the first dummy color filter DCF1 may overlap the non-pixel area NPA and the first, second, and third non-light-emitting areas NPXA-G, NPXA-B, and NPXA-R. The first dummy color filter DCF1 may not overlap the first and third light emitting areas PXA-G and PXA-R.

The input sensing layer ISL may be disposed on the display panel DP and the first color filter layer CFL1. An input sensing unit ISP may include the first conductive layer, an insulating layer IL, the second conductive layer, and a protective layer PL. The first conductive layer may be disposed on the first color filter layer CFL1. As an example, the first conductive layer may include the first connection portion CP1. FIGS. 6A and 6B show the structure in which the first conductive layer is disposed directly on the first color filter layer CFL1, however, embodiments are not be limited thereto or thereby. The input sensing layer ISL may further include a base insulating layer disposed between the first conductive layer and the first color filter layer CFL1. In this case, the first color filter layer CFL1 may be covered by the base insulating layer, and the first conductive layer may be disposed on the base insulating layer. As an example, the base insulating layer may include an inorganic insulating material.

The insulating layer IL may be disposed on the first color filter layer CFL1 and the thin film encapsulation layer TFL and may cover the first conductive layer. The insulating layer may include an inorganic insulating material. For instance, the insulating layer IL may include a silicon nitride layer.

The second conductive layer may be disposed on the insulating layer IL. The second conductive layer may include the first sensing portion SP1, the second sensing portion SP2, and the second connection portion CP2. The insulating layer IL may be disposed between the first conductive layer and the second conductive layer. The insulating layer IL may separate the first conductive layer from the second conductive layer in a cross-sectional view. The insulating layer IL may include the first and second contact portions CNT1 and CNT2 (refer to FIG. 5B), which has, e.g., a hole shape to partially expose the first sensing portion SP1. The first connection portion CP1 may be connected to the first sensing portion SP1 via the first and second contact portions CNT1 and CNT2.

The protective layer PL may be disposed on the second conductive layer. The protective layer PL may include an organic insulating material. The organic insulating material may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. However, this is merely one example, and the organic insulating material should not be limited thereto or thereby. The protective layer PL may protect the first and second conductive layers from moisture and oxygen and may protect the first and second conductive layers from a foreign substance.

The second color filter layer CFL2 may be disposed on the input sensing layer ISL. The second color filter layer CFL2 may include a second color filter CF2 and a third color filter CF3. The second color filter CF2 may be disposed in the first light emitting area PXA-G to overlap the first light emitting element ED1, and the third color filter CF3 may be disposed in the third light emitting area PXA-R to overlap the third light emitting element ED3. The second color filter CF2 may have a second color, and the third color filter CF3 may have a third color. The second and third color filters CF2 and CF3 may have a color different from that of the first color filter CF1. As an example, the first color filter CF1 may have a blue color, the second color filter CF2 may have a green color, and the third color filter CF3 may have a red color.

The second color filter layer CFL2 may further include a second dummy color filter DCF2 disposed to overlap the sensors OPD. As an example, when an area in which the light sensing layer ORL is disposed is defined as a sensing area SA and a periphery of the sensing area SA is defined as a non-sensing area NSA, the second dummy color filter DCF2 may be disposed to correspond to the sensing area SA. The second dummy color filter DCF2 may overlap the sensing area SA and the non-sensing area NSA.

As an example, the second dummy color filter DCF2 may have the same color as that of the second color filter CF2. For example, the second dummy color filter DCF2 and the second color filter CF2 may have the green color.

A black matrix BM may be further disposed between the second color filter layer CFL2 and the input sensing layer ISL. The black matrix BM may be disposed to overlap the second and third color filters CF2 and CF3. In addition, the black matrix BM may be provided to correspond to the non-pixel area NPA. As an example, the black matrix BM may overlap the non-pixel area NPA and the first, second, and third non-light-emitting areas NPXA-G, NPXA-B, and NPXA-R and may not overlap the first, second, and third light emitting areas PXA-G, PXA-B, and PXA-R. The black matrix BM may include an organic material or a metal material. A material for the black matrix BM should not be particularly limited as long as the material reflects or absorbs a light.

The display device DD may further include an overcoating layer OCL that covers the second color filter layer CFL2 and the black matrix BM. The overcoating layer OCL may include an organic insulating material. The overcoating layer OCL may have a thickness enough to remove a step difference occurring between the second color filter layer CFL2 and the black matrix BM. A material for the overcoating layer OCL should not be particularly limited as long as the overcoating layer OCL may have a predetermined thickness and may planarize an upper portion of the second color filter layer CFL2. As an example, the overcoating layer OCL may include an acrylic-based organic material.

Referring to FIG. 6B, when the display device DD (refer to FIG. 2) is operated, each of the first, second, and third light emitting elements ED1, ED2, and ED3 may emit the light. The first light emitting elements ED1 may emit a first color light, the second light emitting elements ED2 may emit a second color light, and the third light emitting elements ED3 may emit a third color light. In this case, the first light Lg1 may be the light in the green wavelength band, the second light may be the light in the blue wavelength band, and the third light Lr1 may be the light in the red wavelength band.

As an example, each of the sensors OPD may be disposed adjacent to the first light emitting elements ED1 among the first, second, and third light emitting elements ED1, ED2, and ED3. During the fingerprint sensing operation, each of the sensors OPD may receive the first reflected light Lg2, which is generated by the reflection of the first light Lg1 on the user's hand US_F after the first light Lg1 is emitted from the first light emitting elements ED1. The first reflected light Lg2 may be a light in the green wavelength band. The second dummy color filter DCF2 may be disposed on the sensors OPD. The second dummy color filter DCF2 may have a green color. The first reflected light Lg2 may be incident into the sensors OPD after passing through the second dummy color filter DCF2.

For example, the second and third lights emitted from the second and third light emitting elements ED2 and ED3 may be also reflected by the user's hand US_F. For example, when a light corresponding to the third light Lr1 emitted from the third light emitting elements ED3 and reflected by the user's hand US_F is defined as a second reflected light Lr2, the second reflected light Lr2 may not pass through the second dummy color filter DCF2 and may be absorbed by the second dummy color filter DCF2. Accordingly, the second reflected light Lr2 may not pass through the second dummy color filter DCF2, and thus, may not be incident into the sensors OPD. In a similar way, although the second light is reflected by the user's hand US_F, the second light may be absorbed by the second dummy color filter DCF2. Accordingly, only the first reflected light Lg2 may be applied to the sensors OPD.

During the fingerprint sensing operation, a portion of the first light Lg1 emitted from the first light emitting elements ED1 may be reflected by one of the first and second conductive layers of the input sensing layer ISL. For example, when the light reflected by the second conductive layer among the first light Lg1 is defined as a third reflected light Lg3, the third reflected light Lg3 may be provided to the first dummy color filter DCF1 disposed under the second conductive layer. Since the first dummy color filter DCF1 has the blue color, the first dummy color filter DCF1 may absorb the third reflected light Lg3 with the green wavelength band. For example, the third reflected light Lg3 may not pass through the first dummy color filter DCF1 and may be absorbed by the first dummy color filter DCF1.

As shown in FIG. 7, in a case where the first dummy color filter DCF1 has the red color, the third reflected light Lg3 may not pass through the first dummy color filter DCF1 and may be absorbed by the first dummy color filter DCF1. However, in a case where an absorption rate of the third reflected light Lg3 when the first dummy color filter DCF1 has the blue color is referred to as a first absorption rate and the absorption rate of the third reflected light Lg3 when the first dummy color filter DCF1 has the red color is referred to as a second absorption rate, the first absorption rate may be greater than the second absorption rate.

For example, the second and third lights emitted from the second and third light emitting elements ED2 and ED3 may be reflected by one of the first and second conductive layers. For example, when a light corresponding to the third light Lr1 emitted from the third light emitting elements ED3 and reflected by the second conductive layer is defined as a fourth reflected light Lr3, the fourth reflected light Lr3 may not pass through the first dummy color filter DCF1 and may be absorbed by the first dummy color filter DCF1.

As described above, in a case where the first light Lg1 is reflected by other members such as a conductive layer other than the user's hand US_F and is incident into the sensors OPD, a noise applied to the sensors OPD may increase. However, as the first dummy color filter DCF1 is disposed under the first and second conductive layers, the noise may be removed. Accordingly, the performance and the reliability of the fingerprint sensing operation using the sensors OPD may be improved.

Figure 8:
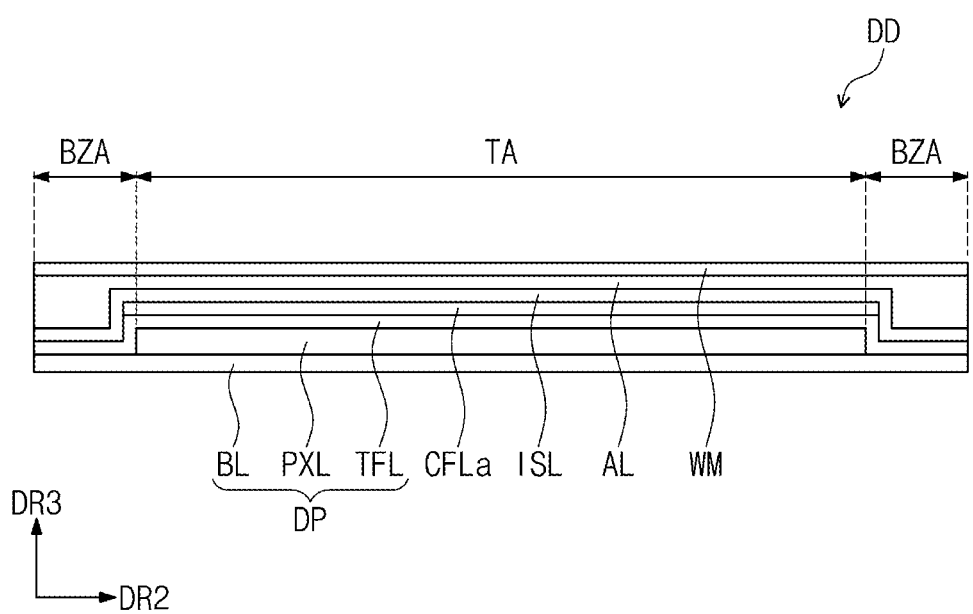
FIG. 8 is a cross-sectional view of another embodiment of the display device of FIG. 1.
Figure 9A:
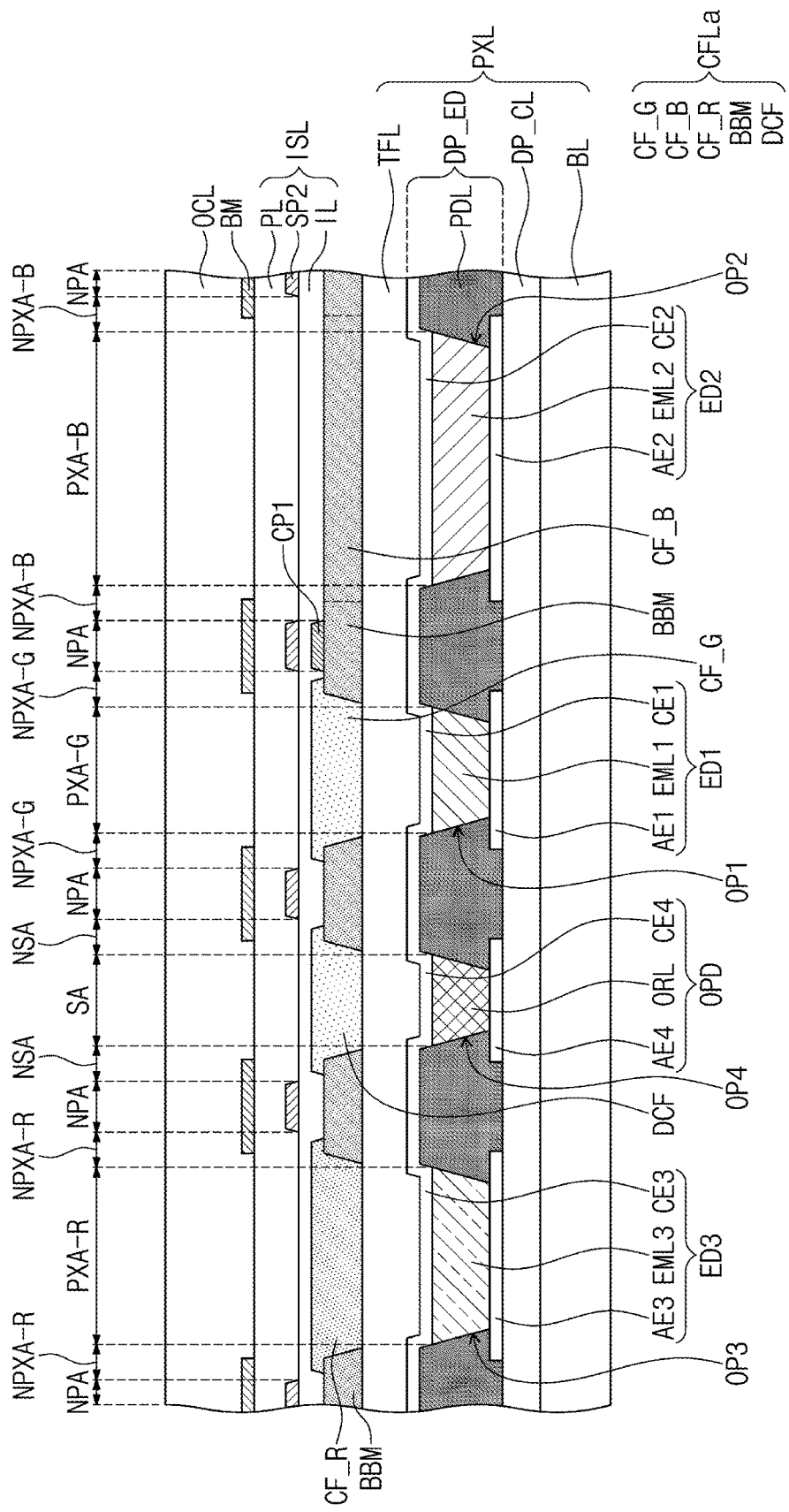
FIG. 9A is a cross-sectional view of the display device of FIG. 8.
Figure 9B:
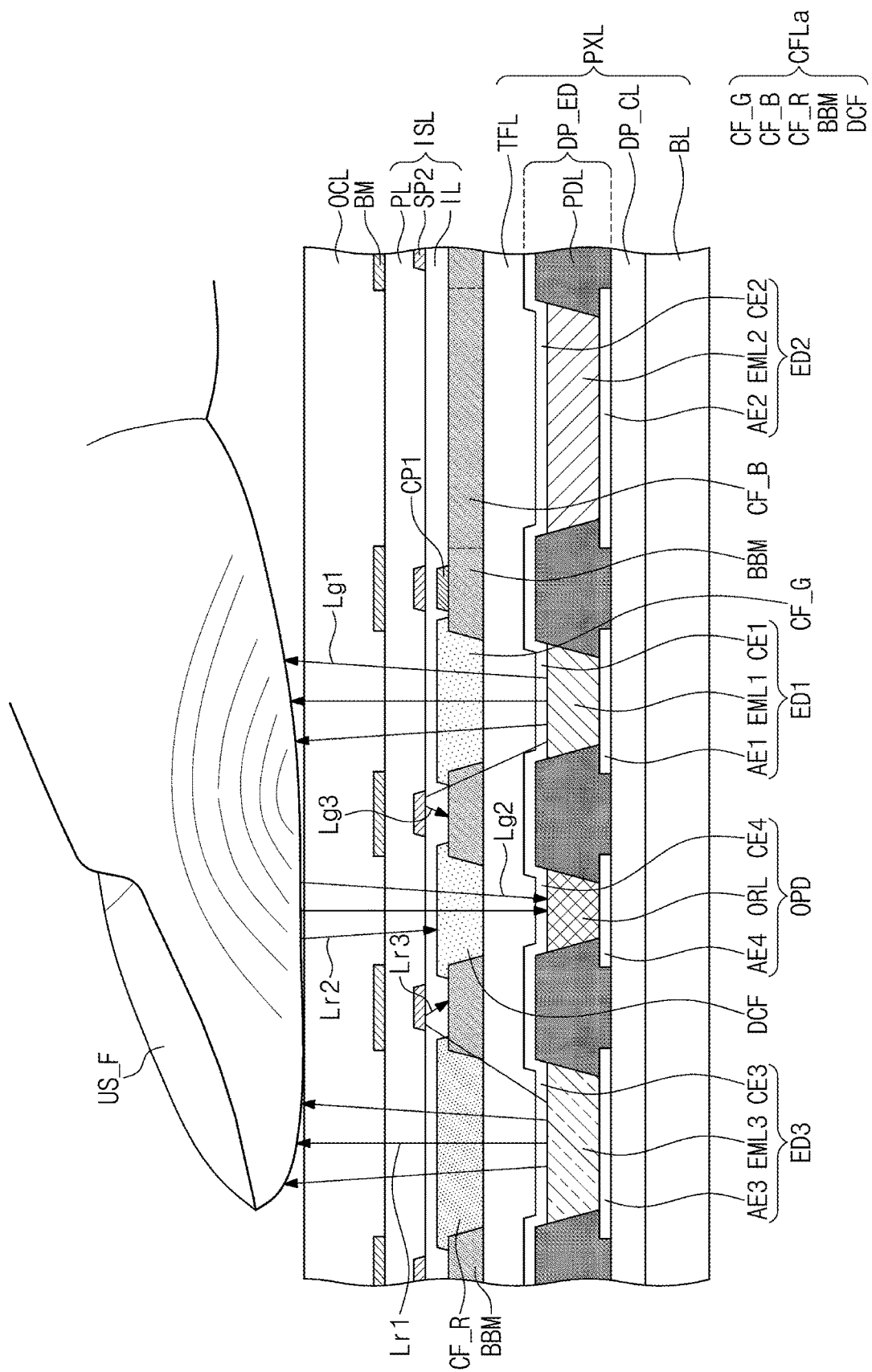
FIG. 9B is a cross-sectional view illustrating a fingerprint sensing process of the display device of FIG. 9A.

FIG. 8 is a cross-sectional view illustrating a display device DD according to an embodiment, FIG. 9A is a partially enlarged cross-sectional view illustrating the display device DD shown in FIG. 8, and FIG. 9B is a cross-sectional view illustrating a fingerprint sensing process of the display device DD shown in FIG. 9A. In FIGS. 8, 9A, and 9B, the same reference numerals denote the same elements in FIGS. 2, 6A, and 6B, and thus, detailed descriptions of the same elements will be omitted for descriptive convenience.

Referring to FIGS. 8, 9A, and 9B, the display device DD may include a display panel DP, a color filter layer CFLa disposed on the display panel DP, and an input sensing layer ISL disposed on the color filter layer CFLa. The display panel DP may include a base layer BL, a pixel layer PXL disposed on the base layer BL, and a thin film encapsulation layer TFL.

The color filter layer CFLa may be disposed directly on the display panel DP. The color filter layer CFLa may be disposed directly on the thin film encapsulation layer TFL of the display panel DP. The color filter layer CFLa may include a first color filter CF_G, a second color filter CF_B, and a third color filter CF_R. The first color filter CF_G may have a first color, the second color filter CF_B may have a second color, and the third color filter CF_R may have a third color. As an example, the first color may be a green color, the second color may be a blue color, and the third color may be a red color.

The color filter layer CFLa may further include a color layer in the form of a dummy color filter DCF. As an example, when an area in which a light sensing layer ORL is disposed is defined as a sensing area SA and a periphery of the sensing area SA is defined as a non-sensing area NSA, the dummy color filter DCF may be disposed to correspond to the sensing area SA. The dummy color filter DCF may overlap the sensing area SA and the non-sensing area NSA. As an example, the dummy color filter DCF may have the same color of the first color filter CF_G. For example, the dummy color filter DCF and the first color filter CF_G may have the green color.

The color filter layer CFLa may further include a blue-black matrix BBM. The blue-black matrix BBM may be disposed to correspond to a non-pixel area NPA. The blue-black matrix BBM may be disposed to correspond to first and second conductive layers in the non-pixel area NPA. The blue-black matrix BBM may have a width greater than a width of each of the first and second conductive layers. As an example, the blue-black matrix BBM may overlap the non-pixel area NPA and first, second, and third non-light-emitting areas NPXA-G, NPXA-B, and NPXA-R. The blue-black matrix BBM may not overlap the first and third light emitting areas PXA-G and PXA-R.

The blue-black matrix BBM may have the same color as that of the second color filter CF_B. For example, the blue-black matrix BBM and the second color filter CF_B may have the blue color. The blue-black matrix BBM may be substantially simultaneously formed with the second color filter CF_B through the same process. In addition, the blue-black matrix BBM may partially overlap the first and third color filters CF_G and CF_R in a plane.

The input sensing layer ISL may be disposed on the color filter layer CFLa. An input sensing unit ISP may include the first conductive layer, an insulating layer IL, the second conductive layer, and a protective layer PL. The first conductive layer may be disposed on the color filter layer CFLa. As an example, the first conductive layer may include a first connection portion CP1. FIGS. 9A and 9B show a structure in which the first conductive layer is disposed directly on the color filter layer CFLa, however, embodiments are not be limited thereto or thereby. The input sensing layer ISL may further include a base insulating layer disposed between the first conductive layer and the color filter layer CFLa. In this case, the color filter layer CFLa may be covered by the base insulating layer, and the first conductive layer may be disposed on the base insulating layer. As an example, the base insulating layer may include an inorganic insulating material.

The insulating layer IL may be disposed on the color filter layer CFLa and may cover the first conductive layer. The insulating layer IL may include an inorganic insulating material. For instance, the insulating layer IL may include a silicon nitride layer.

The second conductive layer may be disposed on the insulating layer IL. The second conductive layer may include a first sensing portion SP1, a second sensing portion SP2, and a second connection portion CP2. The insulating layer IL may be disposed between the first conductive layer and the second conductive layer. The insulating layer IL may separate the first conductive layer from the second conductive layer in a cross-sectional view. The insulating layer IL may include first and second contact portions CNT1 and CNT2 (refer to FIG. 5B), which has, e.g., a hole shape to partially expose the first sensing portion SP1. The first connection portion CP1 may be connected to the first sensing portion SP1 via the first and second contact portions CNT1 and CNT2.

The protective layer PL may be disposed on the second conductive layer. The protective layer PL may include an organic insulating material. The organic insulating material may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin. However, this is merely one example, and the organic insulating material should not be limited thereto or thereby. The protective layer PL may protect the first and second conductive layers from moisture and oxygen and may protect the first and second conductive layers from a foreign substance.

A black matrix BM may be disposed on the input sensing layer ISL. The black matrix BM may overlap the blue-black matrix BBM and the first and second conductive layers in a plane. The black matrix BM may include an organic material or a metal material. A material for the black matrix BM should not be particularly limited as long as the material reflects or absorbs a light. As the black matrix BM is disposed to correspond to the first and second conductive layers, the external light may be blocked not to be reflected by the first and second conductive layers. Accordingly, the reflection of the external light may be prevented such that the reflected external light is not viewed or recognized to the user's eye.

The display device DD may further include an overcoating layer OCL that covers the input sensing layer ISL and the black matrix BM. The overcoating layer OCL may include an organic insulating material. The overcoating layer OCL may have a thickness enough to remove a step difference occurring between the input sensing layer ISL and the black matrix BM. A material for the overcoating layer OCL should not be particularly limited as long as the overcoating layer OCL may have a predetermined thickness and may planarize an upper portion of the input sensing layer ISL. As an example, the overcoating layer OCL may include an acrylic-based organic material.

Referring to FIG. 9B, when the display device DD (refer to FIG. 8) is operated, each of first, second, and third light emitting elements ED1, ED2, and ED3 may emit a light. The first light emitting elements ED1 may emit a first color light, the second light emitting elements ED2 may emit a second color light, and the third light emitting elements ED3 may emit a third color light. In this case, the first light Lg1 may be a light in the green wavelength band, the second light may be a light in the blue wavelength band, and the third light Lr1 may be a light in the red wavelength band.

As an example, each of sensors OPD may be disposed adjacent to the first light emitting elements ED1 among the first, second, and third light emitting elements ED1, ED2, and ED3. During the fingerprint sensing operation, each of the sensors OPD may receive a first reflected light Lg2, which is generated by the reflection of the first light Lg1 on the user's hand US_F after the first light Lg1 is emitted from the first light emitting elements ED1. The first reflected light Lg2 may be the light in the green wavelength band. The dummy color filter DCF may be disposed on the sensors OPD. The dummy color filter DCF may have the green color. The first reflected light Lg2 may be incident into the sensors OPD after passing through the dummy color filter DCF.

For example, the second and third lights emitted from the second and third light emitting elements ED2 and ED3 may be also reflected by the user's hand US_F. For example, when a light corresponding to a third light Lr1 emitted from the third light emitting elements ED3 and reflected by the user's hand US_F is defined as a second reflected light Lr2, the second reflected light Lr2 may not pass through the dummy color filter DCF and may be absorbed by the dummy color filter DCF. Accordingly, the second reflected light Lr2 may not pass through the dummy color filter DCF, and thus, may not be incident into the sensors OPD. In a similar way, although the second light is reflected by the user's hand US_F, the second light may be absorbed by the dummy color filter DCF. Accordingly, only the first reflected light Lg2 may be applied or transmitted to the sensors OPD.

During the fingerprint sensing operation, a portion of the first light Lg1 emitted from the first light emitting elements ED1 may be reflected by one of the first and second conductive layers of the input sensing layer ISL. For example, when the light reflected by the second conductive layer among the first light Lg1 is defined as a third reflected light Lg3, the third reflected light Lg3 may be provided to the blue-black matrix BBM disposed under the second conductive layer. Since the blue-black matrix BBM has the blue color, the blue-black matrix BBM may absorb the third reflected light Lg3 with the green wavelength band. For example, the third reflected light Lg3 may not pass through the blue-black matrix BBM and may be absorbed by the blue-black matrix BBM. Accordingly, the blue-black matrix BBM may be used as a light blocking layer or a light absorbing layer.

For example, the second and third lights emitted from the second and third light emitting elements ED2 and ED3 may be reflected by one of the first and second conductive layers. For example, when the light corresponding to the third light Lr1 emitted from the third light emitting elements ED3 and reflected by the second conductive layer is defined as a fourth reflected light Lr3, the fourth reflected light Lr3 may not pass through the blue-black matrix BBM and may be absorbed by the blue-black matrix BBM.

As described above, in a case where the first light Lg1 is reflected by other members such as a conductive layer other than the user's hand US_F and is incident into the sensors OPD, a noise applied to the sensors OPD may increase. However, as the blue-black matrix BBM is disposed under the first and second conductive layers, the noise may be removed. Accordingly, the performance and the reliability of the fingerprint sensing operation using the sensors OPD may be improved.

Figure 10:
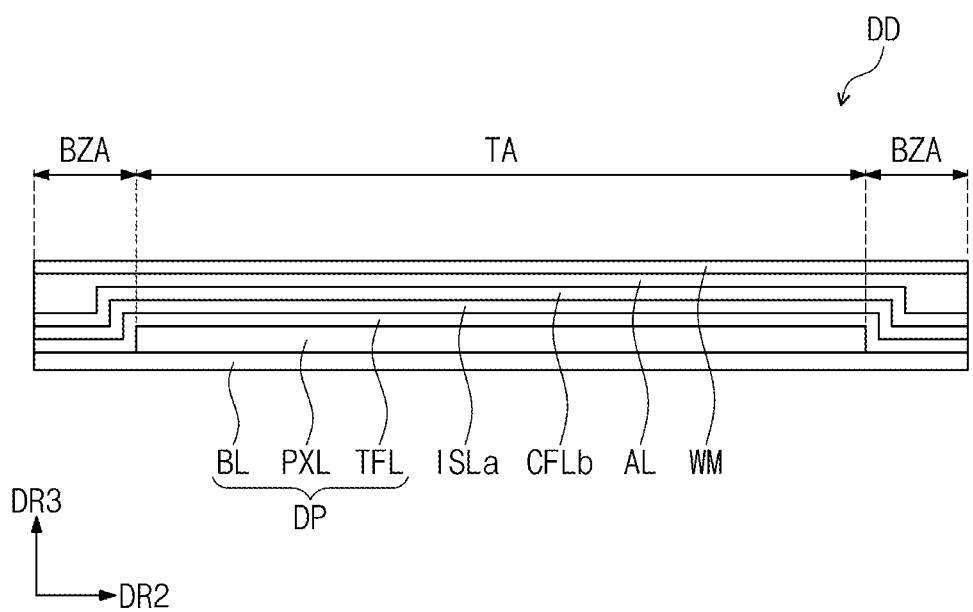
FIG. 10 is a cross-sectional view of another embodiment of the display device of FIG. 1.
Figure 11A:
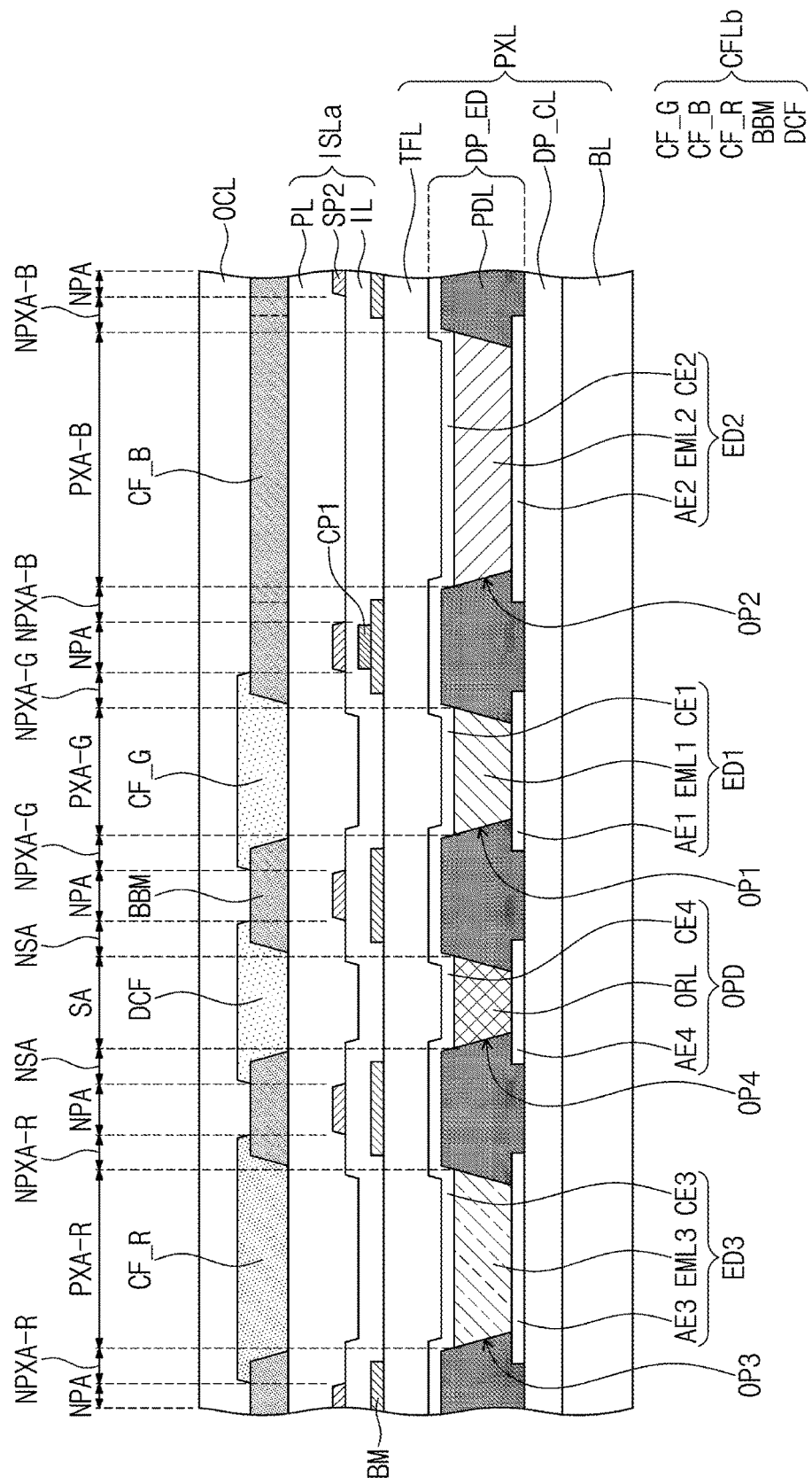
FIG. 11A is a cross-sectional view of the display device of FIG. 10.
Figure 11B:
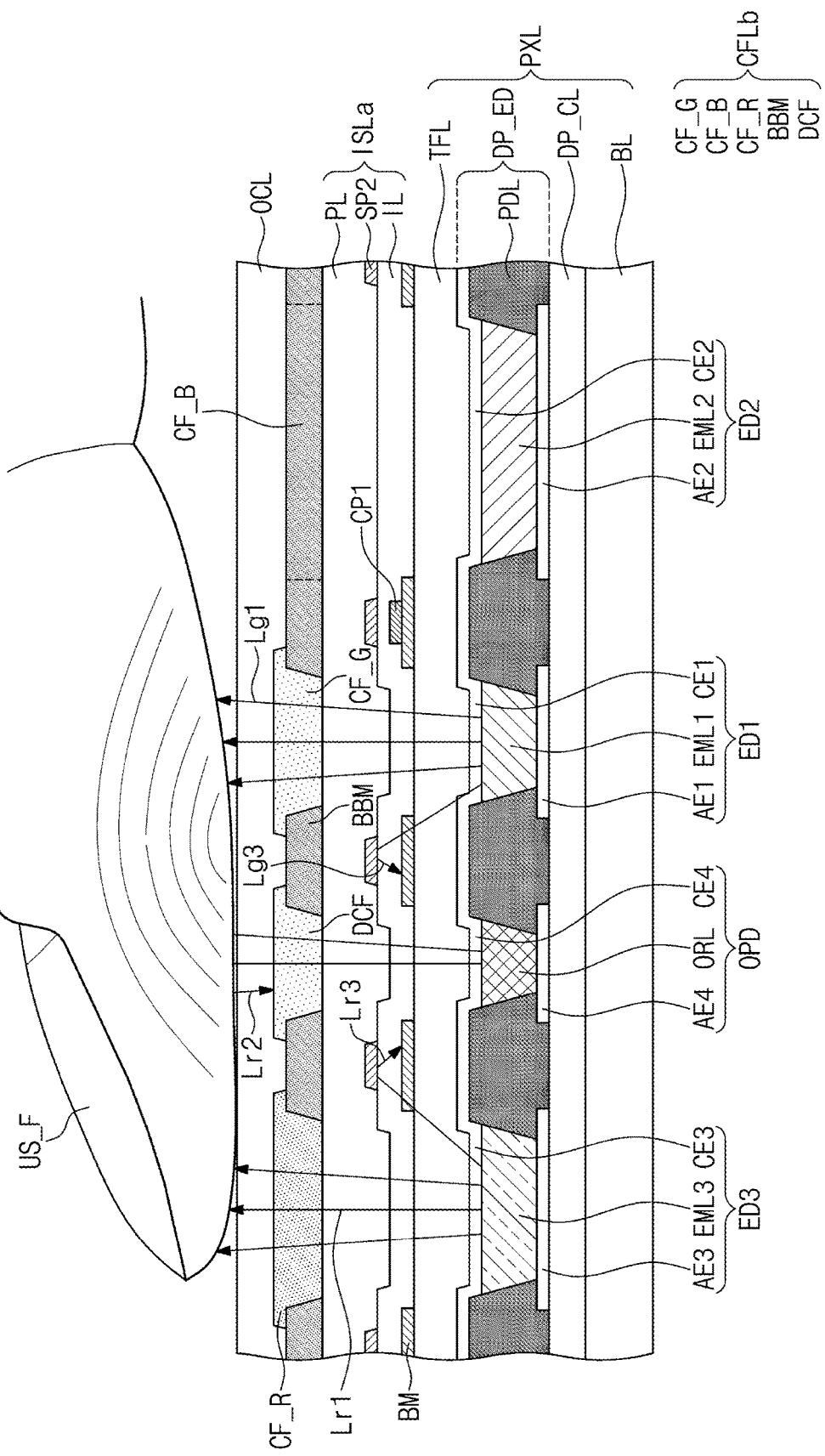
FIG. 11B is a cross-sectional view illustrating a fingerprint sensing process of the display device of FIG. 11A.

FIG. 10 is a cross-sectional view illustrating a display device DD according to an embodiment, FIG. 11A is a partially enlarged cross-sectional view illustrating the display device DD shown in FIG. 10, and FIG. 11B is a cross-sectional view illustrating a fingerprint sensing process of the display device DD shown in FIG. 11A. In FIGS. 10, 11A, and 11B, the same reference numerals denote the same elements in FIGS. 8, 9A, and 9B, and thus, detailed descriptions of the same elements will be omitted for descriptive convenience.

Referring to FIGS. 10, 11A, and 11B, the display device DD may include a display panel DP, an input sensing layer ISLa disposed on the display panel DP, and a color filter layer CFLb disposed on the input sensing layer ISLa.

The input sensing layer ISLa may be disposed directly on the display panel DP. The input sensing layer ISLa may be disposed directly on a thin film encapsulation layer TFL of the display panel DP. The input sensing layer ISLa may include a color layer in the form of a black matrix BM, a first conductive layer, an insulating layer IL, a second conductive layer, and a protective layer PL. The black matrix BM may be disposed on the thin film encapsulation layer TFL. FIGS. 11A and 11B show the structure in which the black matrix BM is disposed directly on the thin film encapsulation layer TFL, however, embodiments are not be limited thereto or thereby. The input sensing layer ISLa may further include a base insulating layer disposed between the black matrix BM and the thin film encapsulation layer TFL. In this case, the thin film encapsulation layer TFL may be covered by the base insulating layer, and the black matrix BM may be disposed on the base insulating layer. As an example, the base insulating layer may include an inorganic insulating material.

The first conductive layer may be disposed on the black matrix BM. The first conductive layer may include a first connection portion CP1. The insulating layer IL may be disposed on a color filter layer CFLb and may cover the first conductive layer. The second conductive layer may be disposed on the insulating layer IL. The second conductive layer may include a first sensing portion SP1, a second sensing portion SP2, and a second connection portion CP2. The black matrix BM may overlap the first and second conductive layers in a plane. The black matrix BM may have a width greater than a width of each of the first and second conductive layers.

The protective layer PL may be disposed on the second conductive layer. The protective layer PL may include an organic insulating material. The protective layer PL may protect the first and second conductive layers from moisture and oxygen and may protect the first and second conductive layers from a foreign substance.

The color filter layer CFLb may be disposed on the input sensing layer ISLa. The color filter layer CFLb may be disposed directly on the protective layer PL. The color filter layer CFLb may include a first color filter CF_G, a second color filter CF_B, and a third color filter CF_R. The first color filter CF_G may have a first color, the second color filter CF_B may have a second color, and the third color filter CF_R may have a third color. As an example, the first color may have a green color, the second color may have a blue color, and the third color may have a red color.

The color filter layer CFLb may further include a dummy color filter DCF. As an example, when an area in which a light sensing layer ORL is disposed is defined as a sensing area SA and a periphery of the sensing area SA is defined as a non-sensing area NSA, the dummy color filter DCF may be disposed to correspond to the sensing area SA. The dummy color filter DCF may overlap the sensing area SA and the non-sensing area NSA. As an example, the dummy color filter DCF may have the same color as that of the first color filter CF_G. For example, the dummy color filter DCF and the first color filter CF_G may have the green color.

The color filter layer CFLb may further include a blue-black matrix BBM. The blue-black matrix BBM may be disposed to correspond to a non-pixel area NPA. The blue-black matrix BBM may be disposed to overlap the first and second conductive layers in the non-pixel area NPA. As an example, the blue-black matrix BBM may overlap the non-pixel area NPA and first, second, and third non-light-emitting areas NPXA-G, NPXA-B, and NPXA-R. The blue-black matrix BBM may not overlap first and third light emitting areas PXA-G and PXA-R.

The blue-black matrix BBM may have the same color as the second color filter CF_B. For example, the blue-black matrix BBM and the second color filter CF_B may have the blue color. The blue-black matrix BBM may be substantially and simultaneously formed with the second color filter CF_B through the same process. In addition, the blue-black matrix BBM may partially overlap the first and third color filters CF_G and CF_R in a plane.

The display device DD may further include an overcoating layer OCL that covers the color filter layer CFLb. The overcoating layer OCL may include an organic insulating material. The overcoating layer OCL may have a thickness enough to remove a step difference occurring between the color filters CF_G, CF_B, and CF_R. A material for the overcoating layer OCL should not be particularly limited as long as the overcoating layer OCL may have a predetermined thickness and may planarize an upper portion of the color filter layer CFLb. As an example, the overcoating layer OCL may include an acrylic-based organic material.

Referring to FIG. 11B, when the display device DD (refer to FIG. 10) is operated, each of first, second, and third light emitting elements ED1, ED2, and ED3 may emit a light. The first light emitting elements ED1 may emit a first color light, the second light emitting elements ED2 may emit a second color light, and the third light emitting elements ED3 may emit a third color light. In this case, the first light Lg1 may be a light in the green wavelength band, the second light may be the light in a blue wavelength band, and the third light Lr1 may be a light in the red wavelength band.

As an example, each of sensors OPD may be disposed adjacent to the first light emitting elements ED1 among the first, second, and third light emitting elements ED1, ED2, and ED3. During the fingerprint sensing operation, each of the sensors OPD may receive a first reflected light Lg2, which is generated by the reflection of the first light Lg1 emitted from the first light emitting elements ED1 on the user's hand US_F. The first reflected light Lg2 may be the light in the green wavelength band. The dummy color filter DCF may be disposed on the sensors OPD. The dummy color filter DCF may have the green color. The first reflected light Lg2 may be incident into the sensors OPD after passing through the dummy color filter DCF.

For example, the second and third lights emitted from the second and third light emitting elements ED2 and ED3 may be also reflected by the user's hand US_F. For example, when a light corresponding to the third light Lr1 emitted from the third light emitting elements ED3 and reflected by the user's hand US_F is defined as a second reflected light Lr2, the second reflected light Lr2 may not pass through the dummy color filter DCF and may be absorbed by the dummy color filter DCF. Accordingly, the second reflected light Lr2 may not pass through the dummy color filter DCF, and thus, may not be incident into the sensors OPD. In a similar way, although the second light is reflected by the user's hand US_F, the second light may be absorbed by the dummy color filter DCF. Accordingly, only the first reflected light Lg2 may be applied or transmitted to the sensors OPD.

During the fingerprint sensing operation, a portion of the first light Lg1 emitted from the first light emitting elements ED1 may be reflected by one of the first and second conductive layers of the input sensing layer ISLa. For example, when the light reflected by the second conductive layer among the first light Lg1 is defined as a third reflected light Lg3, the third reflected light Lg3 may be provided to the black matrix BM disposed under the second conductive layer. Since the black matrix BM includes an organic material, the black matrix BM may absorb the third reflected light Lg3. For example, the third reflected light Lg3 may not pass through the black matrix BM and may be absorbed by the black matrix BM. Accordingly, the black matrix BM may be used as a light blocking layer or a light absorbing layer.

For example, the second and third lights emitted from the second and third light emitting elements ED2 and ED3 may be reflected by one of the first and second conductive layers. For example, when the light corresponding to the third light Lr1 emitted from the third light emitting elements ED3 and reflected by the second conductive layer is defined as a fourth reflected light Lr3, the fourth reflected light Lr3 may not pass through the black matrix BM and may be absorbed by the black matrix BM.

As described above, in a case where the first light Lg1 is reflected by other members such as a conductive layer other than the user's hand US_F and is incident into the sensors OPD, a noise applied to the sensors OPD may increase. However, as the black matrix BM is disposed under the first and second conductive layers, the noise may be removed. Accordingly, the performance and the reliability of the fingerprint sensing operation using the sensors OPD may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a base substrate comprising a plurality of pixel areas and a plurality of sensing areas between the plurality of pixel areas;
   a pixel layer comprising a plurality of light emitting elements disposed on the plurality of pixel areas of the base substrate and a plurality of sensors disposed on the plurality of sensing areas of the base substrate, the plurality of sensors being adjacent to first light emitting elements among the light emitting elements;
   an input sensing layer comprising a conductive layer; a color layer disposed between the pixel layer and the conductive layer; and
   a thin film encapsulation layer disposed between the pixel layer and the color layer,
   wherein the color layer is disposed directly on the thin film encapsulation layer.

2. The display device of claim 1, further comprising a color filter layer comprising a plurality of color filters disposed to respectively overlap the light emitting elements; and
   a dummy color filter disposed to overlap the sensors.

3. The display device of claim 2, wherein the first light emitting elements are configured to emit a first light having a first wavelength band, and the light emitting elements further comprise:
   second light emitting elements configured to emit a second light having a second wavelength band different from the first wavelength band; and
   third light emitting elements configured to emit a third light having a third wavelength band different from the first wavelength band and the second wavelength band.

4. The display device of claim 3, wherein the color filter layer comprises:
   a first color filter having a first color and disposed to overlap the first light emitting elements;
   a second color filter having a second color different from the first color and disposed to overlap the second light emitting elements; and
   a third color filter having a third color different from the first color and the second color and disposed to overlap the third light emitting elements.

5. The display device of claim 4, wherein the dummy color filter has the first color.

6. The display device of claim 4, wherein the color layer has the second color and comprises a same material as the second color filter.

7. The display device of claim 1, further comprising a light blocking layer disposed on the input sensing layer.

8. The display device of claim 3, wherein the color filter layer is disposed directly on the input sensing layer.

9. The display device of claim 8, wherein the color filter layer comprises:
   a first color filter having a first color and disposed to correspond to the first light emitting elements;
   a second color filter having a second color different from the first color and disposed to correspond to the second light emitting elements; and
   a third color filter having a third color different from the first color and the second color and disposed to correspond to the third light emitting elements.

10. The display device of claim 9, wherein the dummy color filter has the first color.

11. The display device of claim 9, wherein the color filter layer further comprises a light blocking layer having the second color and comprising a same material as the second color filter.

12. The display device of claim 1, wherein:
    the color layer is a light absorbing layer, and
    the color layer has a width greater than a width of the conductive layer.

13. A display device comprising:
    a base substrate comprising a plurality of pixel areas and a plurality of sensing areas between the plurality of pixel areas;
    a pixel layer comprising a plurality of light emitting elements disposed on the plurality of pixel areas of the base substrate and a plurality of sensors disposed on the plurality of sensing areas of the base substrate, the plurality of sensors being adjacent to first light emitting elements among the light emitting elements;
    a first color filter layer disposed on the pixel layer;
    an input sensing layer disposed on the first color filter layer; and a second color filter layer disposed on the input sensing layer, wherein the input sensing layer comprises a conductive layer, and wherein the first color filter layer comprises a first dummy color filter, the first dummy color filter overlapping with the conductive layer and not overlapping with the light emitting elements.

14. The display device of claim 13, wherein:
the first light emitting elements are configured to emit a first light having a first wavelength band, and
the first color filter layer further comprises a first color filter having a first color.

15. The display device of claim 14, wherein:
the first wavelength band is a green wavelength band, and
the first color is a blue color.

16. The display device of claim 14, wherein the light emitting elements further comprise:
second light emitting elements configured to emit a second light having a second wavelength band different from the first wavelength band; and
third light emitting elements configured to emit a third light having a third wavelength band different from the first wavelength band and the second wavelength band.

17. The display device of claim 16, wherein the second color filter layer comprises:
a second color filter having a second color different from the first color and disposed to overlap the first light emitting elements; and
a third color filter having a third color different from the first color and the second color and disposed to correspond to the third light emitting elements.

18. The display device of claim 17, wherein the second color filter layer further comprises a second dummy color filter having the second color and disposed to overlap the sensors.

19. The display device of claim 16, wherein the first color filter is disposed to overlap the second light emitting elements.

20. The display device of claim 19, wherein:
the first dummy color filter has the first color.

21. The display device of claim 20, wherein the first dummy color filter has a width greater than a width of the conductive layer.

22. The display device of claim 20, wherein the conductive layer comprises:
a first conductive layer; and
a second conductive layer disposed on the first conductive layer.

23. The display device of claim 22, wherein:
the input sensing layer further comprises an insulating layer,
the first conductive layer is disposed on the first dummy color filter and covered by the insulating layer, and
the second conductive layer is disposed on the insulating layer.

24. The display device of claim 13, further comprising a thin film encapsulation layer disposed between the pixel layer and the first color filter layer.

25. The display device of claim 13, further comprising a light blocking layer disposed on the input sensing layer.

26. The display device of claim 13, wherein the pixel layer further comprises a pixel definition layer comprising a first opening and a second opening, and wherein:
the light emitting elements are disposed in the first opening overlapping the plurality of pixel areas; and
the sensors are disposed in the second opening overlapping the plurality of sensing areas.

27. The display device of claim 26, wherein the pixel definition layer comprises a black material.

28. The display device of claim 13, wherein each of the sensors comprises a photodiode.

29. An electronic device comprising a display device comprising:
a base substrate comprising a plurality of pixel areas and a plurality of sensing areas between the plurality of pixel areas;
a pixel layer comprising a plurality of light emitting elements disposed on the plurality of pixel areas of the base substrate and a plurality of sensors disposed on the plurality of sensing areas of the base substrate, the plurality of sensors being adjacent to first light emitting elements among the light emitting elements;
a first color filter layer disposed on the pixel layer;
an input sensing layer disposed on the first color filter layer; and
a second color filter layer disposed on the input sensing layer,
wherein the input sensing layer comprises a conductive layer, and
wherein the first color filter layer comprises a first dummy color filter, the first dummy color filter overlapping with the conductive layer and not overlapping with the light emitting elements.

* * * * *